US012665573B2

(12) United States Patent
Noguchi

(10) Patent No.: US 12,665,573 B2
(45) Date of Patent: Jun. 23, 2026

(54) ACOUSTIC WAVE FILTER AND MULTIPLEXER

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 381 days.

(21) Appl. No.: 18/110,395

(22) Filed: Feb. 16, 2023

(65) Prior Publication Data

US 2023/0198502 A1     Jun. 22, 2023

Related U.S. Application Data

(63) Continuation of application No. PCT/JP2021/031667, filed on Aug. 30, 2021.

(30) Foreign Application Priority Data

Sep. 2, 2020     (JP) ................................. 2020-147725

(51) Int. Cl.
  *H03H 9/64*     (2006.01)
  *H03H 9/145*    (2006.01)
  (Continued)

(52) U.S. Cl.
  CPC .......... *H03H 9/6483* (2013.01); *H03H 9/145* (2013.01); *H03H 9/25* (2013.01); *H03H 9/72* (2013.01)

(58) Field of Classification Search
  CPC ........ H03H 9/6483; H03H 9/145; H03H 9/25; H03H 9/72; H03H 9/6436; H03H 9/725
  See application file for complete search history.

(56) References Cited

U.S. PATENT DOCUMENTS

2001/0028286 A1     10/2001     Takamine
2009/0201105 A1     8/2009     Ouchi
(Continued)

FOREIGN PATENT DOCUMENTS

CN        109661777 A      4/2019
JP        2001326557 A     11/2001
(Continued)

OTHER PUBLICATIONS

International Search Report in PCT/JP2021/031667, mailed Oct. 12, 2021, 3 pages.
(Continued)

*Primary Examiner* — Andrea Lindgren Baltzell
*Assistant Examiner* — Kimberly E Glenn
(74) *Attorney, Agent, or Firm* — Keating & Bennett, LLP

(57)     ABSTRACT

An acoustic wave filter includes a first filter circuit on a first path and an additional circuit connected to the first path. The first filter circuit includes a series arm resonator and a longitudinally coupled resonator. The longitudinally coupled resonator includes a first acoustic wave resonator and a first reflector. The additional circuit includes a second acoustic wave resonator on the opposite side of the first acoustic wave resonator with respect to the first reflector. The second acoustic wave resonator includes a first end connected to the first path through a second path and a second end connected to ground. The series arm resonator is connected to a portion of the first path between a connection node at which the second acoustic wave resonator is connected to the first path and the longitudinally coupled resonator.

18 Claims, 13 Drawing Sheets

(51) Int. Cl.
  *H03H 9/25*  (2006.01)
  *H03H 9/72*  (2006.01)

(56)  References Cited

U.S. PATENT DOCUMENTS

| | | | |
|---|---|---|---|
| 2010/0060372 A1 | 3/2010 | Funahashi et al. | |
| 2017/0099043 A1* | 4/2017 | Goto ..................... | H03H 9/725 |
| 2017/0331456 A1 | 11/2017 | Ono | |
| 2019/0190496 A1 | 6/2019 | Nosaka | |

FOREIGN PATENT DOCUMENTS

| | | | |
|---|---|---|---|
| JP | 2017204743 A | 11/2017 |
| WO | 2008078496 A1 | 7/2008 |
| WO | 2008146552 A1 | 12/2008 |
| WO | 2010001534 A1 | 1/2010 |

OTHER PUBLICATIONS

Written Opinion in PCT/JP2021/031667, mailed Oct. 12, 2021, 4 pages.
Official Communication issued in corresponding Chinese Patent Application No. 202180053961.7, mailed on Jun. 27, 2025, 7 pages.

* cited by examiner

ACOUSTIC WAVE FILTER AND MULTIPLEXER

CROSS REFERENCE TO RELATED APPLICATIONS

This application claims the benefit of priority to Japanese Patent Application No. 2020-147725 filed on Sep. 2, 2020 and is a Continuation application of PCT Application No. PCT/JP2021/031667 filed on Aug. 30, 2021. The entire contents of each application are hereby incorporated herein by reference.

BACKGROUND OF THE INVENTION

1. Field of the Invention

The present invention relates to an acoustic wave filter including a longitudinally coupled resonator and a multiplexer including the acoustic wave filter.

2. Description of the Related Art

Hitherto, ladder acoustic wave filters including series arm resonators and parallel arm resonators have been known. As an example of this type of acoustic wave filter, Japanese Unexamined Patent Application Publication No. 2017-204743 discloses an acoustic wave filter including a ladder filter circuit with a pass band that is a predetermined frequency band and a cancel line connected in parallel to the filter circuit.

SUMMARY OF THE INVENTION

In the acoustic wave filter disclosed in Japanese Unexamined Patent Application Publication No. 2017-204743, an unwanted wave outside the pass band is canceled by applying the opposite phase to the unwanted wave by using the cancel line. However, for example, when a filter circuit includes a longitudinally coupled resonator, since the phase of an unwanted wave outside the pass band drastically changes, it is difficult to cancel the unwanted wave with the above-mentioned cancel line by taking the phase change into account. Thus, in an acoustic wave filter including a longitudinally coupled resonator, attenuation outside the pass band cannot be ensured, which is a problem.

Preferred embodiments of the present invention provide acoustic wave filters or the like each including a longitudinally coupled resonator and ensures attenuation outside the pass band.

An acoustic wave filter according to an aspect of a preferred embodiment of the present invention includes a first filter circuit on a first path that connects a first terminal to a second terminal, and an additional circuit connected to the first path. The first filter circuit includes one or more series arm resonators, and a longitudinally coupled resonator connected to a predetermined series arm resonator of the one or more series arm resonators. The longitudinally coupled resonator includes a first acoustic wave resonator, and a first reflector in a propagation direction of an acoustic wave excited by the first acoustic wave resonator with respect to the first acoustic wave resonator. The additional circuit includes a second acoustic wave resonator on an opposite side of the first acoustic wave resonator with respect to the first reflector in the propagation direction of the acoustic wave. The second acoustic wave resonator includes a first end connected to the first path through a second path that is different from the first path and a second end connected to ground. The predetermined series arm resonator is connected to a portion of the first path between a connection node at which the second acoustic wave resonator is connected to the first path and the longitudinally coupled resonator.

A multiplexer according to an aspect of a preferred embodiment of the present invention includes the above-mentioned acoustic wave filter, and a second filter circuit that is different from the acoustic wave filter. The acoustic wave filter and the second filter circuit are connected to a common terminal. On the first path, the connection node at which the second acoustic wave resonator is connected to the first path is closer to the common terminal than a connection node at which the predetermined series arm resonator is connected to the first path.

According to preferred embodiments of the present invention, in the acoustic wave filters or the like including the longitudinally coupled resonator, attenuation outside the pass band can be ensured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
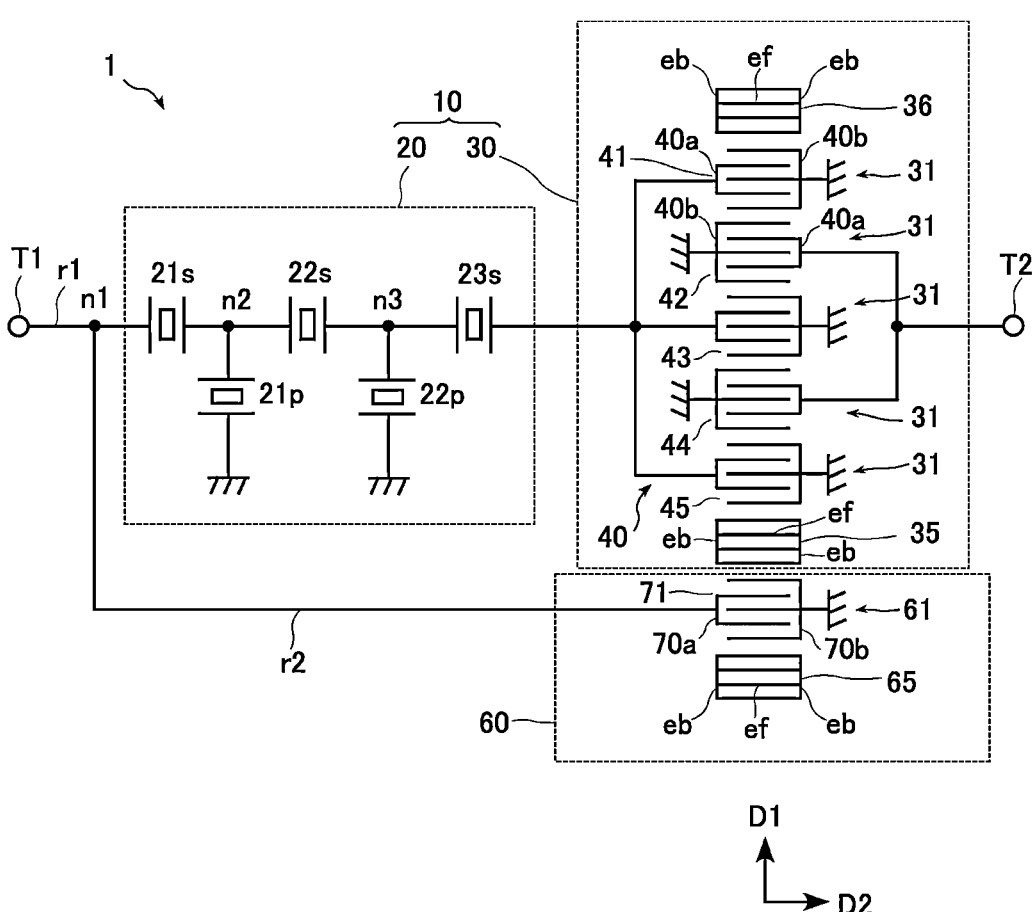
FIG. 1 is a circuit configuration diagram of an acoustic wave filter according to Preferred Embodiment 1 of the present invention.

Preferred embodiments of the present invention will be described in detail with reference to the preferred embodiments and the drawings. Note that the preferred embodiments described below represent comprehensive or specific examples. Numerical values, shapes, materials, components, the arrangements and connection configurations of the components, and the like described in the following preferred embodiments are examples and are not intended to limit the present invention. Out of the components of the following preferred embodiments, components not described in any independent claim are optional components. Further, the sizes of the components or the ratios of the sizes of the components illustrated in the drawings are not necessarily exact. Further, the same reference characters are added to substantially the same components in the respective drawings and a redundant description may be omitted or simplified. Further, in the following preferred embodiments, "connection" includes not only a direct connection but also an electrical connection with the interposition of other elements or the like.

Preferred Embodiment 1

1-1. Configuration of Acoustic Wave Filter

The configuration of an acoustic wave filter according to Preferred Embodiment 1 is described with reference to FIG. 1.

FIG. 1 is a circuit configuration diagram of an acoustic wave filter 1 according to Preferred Embodiment 1. Note that, in FIG. 1 and the other circuit configuration diagrams, electrodes and wiring are represented by the solid lines.

The acoustic wave filter 1 is a band pass filter with a pass band that is a predetermined frequency band. As illustrated in FIG. 1, the acoustic wave filter 1 includes a first filter circuit 10 and an additional circuit 60 additionally connected to the first filter circuit 10.

The first filter circuit 10 is provided on a first path r1 that connects a first terminal T1 to a second terminal T2. The first filter circuit 10 is, for example, a reception filter with a pass band that is a reception band or a transmission filter with a pass band that is a transmission band.

The first filter circuit 10 includes a ladder circuit 20 and a longitudinally coupled resonator 30 connected in series to the ladder circuit 20.

The ladder circuit 20 includes a first end connected to the first terminal T1 and a second end connected to the longitudinally coupled resonator 30. The ladder circuit 20 includes at least one of one or more series arm resonators and one or more parallel arm resonators. Specifically, the ladder circuit 20 includes series arm resonators 21*s*, 22*s*, and 23*s* and parallel arm resonators 21*p* and 22*p*, which are acoustic wave resonators.

The series arm resonators 21*s* to 23*s* are provided at a portion of the first path r1 that connects the first terminal T1 to the longitudinally coupled resonator 30. The series arm resonators 21*s* to 23*s* are connected in series in this order from the first terminal T1 to the longitudinally coupled resonator 30.

The parallel arm resonators 21*p* and 22*p* are provided on paths that connect respective connection nodes n2 and n3 between adjacent two of the series arm resonators 21*s* to 23*s* on the first path r1 to reference terminals (ground) and connected in parallel to each other. Specifically, of the parallel arm resonators 21*p* and 22*p*, the parallel arm resonator 21*p* closest to the first terminal T1 includes a first end connected to the connection node n2 between the series arm resonators 21*s* and 22*s* and a second end connected to the reference terminal. The parallel arm resonator 22*p* includes a first end connected to the connection node n3 between the series arm resonators 22*s* and 23*s* and a second end connected to the reference terminal. In this way, the ladder circuit 20 has a T-shaped ladder filter structure including the three series arm resonators 21*s* to 23*s* disposed on the first path r1 and the two parallel arm resonators 21*p* and 22*p* disposed on the paths that connect the first path r1 to the reference terminals.

The longitudinally coupled resonator 30 is a longitudinally coupled acoustic wave resonator including a plurality of acoustic wave resonators. The longitudinally coupled resonator 30 includes a first end connected to the series arm resonator 23*s* of the plurality of series arm resonators 21*s* to 23*s* and a second end connected to the second terminal T2.

The longitudinally coupled resonator 30 includes a plurality of first acoustic wave resonators 31. The first acoustic wave resonators 31 are, for example, resonators that use surface acoustic waves (SAW) and include a substrate with piezoelectricity and interdigital transducer (IDT) electrodes. The plurality of first acoustic wave resonators 31 are disposed along a propagation direction D1 of an acoustic wave excited by the first acoustic wave resonators 31. The longitudinally coupled resonator 30 of the present preferred embodiment includes the above-mentioned substrate and an IDT electrode group 40 including a plurality of IDT electrodes 41, 42, 43, 44, and 45 sequentially disposed along the propagation direction D1 of an acoustic wave.

The IDT electrodes 41 to 45 each include a plurality of comb electrodes 40*a* and 40*b* that face each other. Here, of the plurality of comb electrodes 40*a* and 40*b*, the comb electrode connected to the signal path is referred to as a comb electrode 40*a* and the comb electrode connected to the ground is referred to as the other comb electrode 40*b*.

The comb electrodes 40*a* of the IDT electrodes 41, 43, and 45 are connected in parallel to each other and connected to the ladder circuit 20, and the other comb electrodes 40*b* thereof are each connected to the ground. The comb electrodes 40*a* of the IDT electrodes 42 and 44 are connected in parallel to each other and connected to the second terminal T2, and the other comb electrodes 40*b* thereof are each connected to the ground.

Further, the longitudinally coupled resonator 30 includes a plurality of first reflectors 35 and 36. The plurality of first reflectors 35 and 36 are disposed at the respective outer side portions of the IDT electrode group 40 to sandwich the IDT electrode group 40 in the propagation direction D1 of an acoustic wave.

The additional circuit 60 is a circuit to cancel an unwanted wave outside the pass band of the first filter circuit 10. A band outside the pass band is a frequency band outside the pass band of the first filter circuit 10.

The additional circuit 60 includes a second acoustic wave resonator 61 and a second reflector 65.

The second acoustic wave resonator 61 is a resonator that uses a surface acoustic wave, like the first acoustic wave resonators 31. The second acoustic wave resonator 61 is disposed on the opposite side of the first acoustic wave resonators 31 with respect to the first reflector 35 in the propagation direction D1 of an acoustic wave. The second acoustic wave resonator 61 is overlapped with the first acoustic wave resonators 31 when viewed from the propagation direction D1 of an acoustic wave and acoustically coupled to the first acoustic wave resonators 31 with the first reflector 35 interposed therebetween. That is, the second acoustic wave resonator 61 is acoustically coupled to the longitudinally coupled resonator 30. The second reflector 65 is disposed on the opposite side of the first reflector 35 with respect to the second acoustic wave resonator 61 in the propagation direction D1 of an acoustic wave.

The second acoustic wave resonator 61 includes a first end connected, through a second path r2 that is different from the first path r1, to a portion of the first path r1 located on the opposite side of the longitudinally coupled resonator 30 with respect to the predetermined series arm resonator 23s. In other words, the one end of the second acoustic wave resonator 61 is connected to, of the plurality of series arms of the plurality of series arm resonators 21s to 23s, the series arm located on the opposite side of the longitudinally coupled resonator 30 with respect to the predetermined series arm resonator 23s. That is, the predetermined series arm resonator 23s is connected to a portion of the first path r1 between a connection node n1 at which the second acoustic wave resonator 61 is connected to the first path r1 and the longitudinally coupled resonator 30. Note that the second path r2 is a path that connects the first path r1 to the ground. The second acoustic wave resonator 61 is provided on the second path r2 that connects the connection node n1 on the first path r1 to the ground, and the second acoustic wave resonator 61 includes a second end connected to the ground.

Specifically, the second acoustic wave resonator 61 includes the substrate and an IDT electrode 71, and the IDT electrode 71 includes a plurality of comb electrodes 70a and 70b that face each other. The comb electrode 70a of the plurality of comb electrodes 70a and 70b is connected to a portion of the first path r1 located between the first terminal T1 and the predetermined series arm resonator 23s, and the other comb electrode 70b is connected to the ground. More specifically, the comb electrode 70a is connected to the connection node n1 between the first terminal T1 and the series arm resonator 21s on the first path r1. Note that the comb electrode 70a is not necessarily connected to the connection node n1 and may be connected to the connection node n2 or n3. The comb electrode 70a is desirably not connected to a portion of the first path (series arm) between the predetermined series arm resonator 23s and the longitudinally coupled resonator 30.

1-2. Electrode Structure of Acoustic Wave Filter

Figure 2:
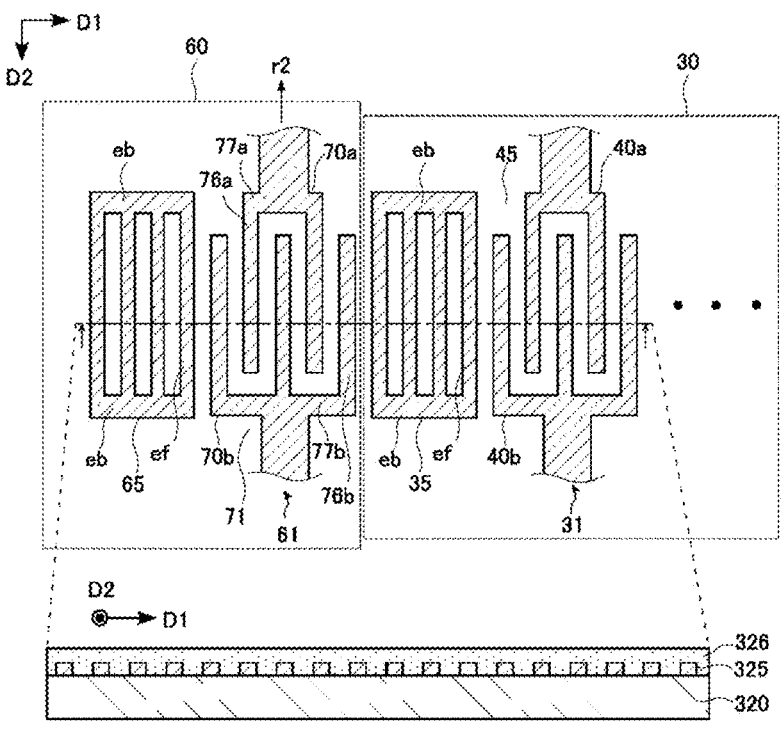
FIG. 2 includes a plan view and a sectional view schematically illustrating the electrode structure of a portion of the acoustic wave filter according to Preferred Embodiment 1 of the present invention.

FIG. 2 includes a plan view and a sectional view schematically illustrating the electrode structure of a portion of the acoustic wave filter 1. Note that the electrode structure illustrated in FIG. 2 is provided to describe a typical structure of the resonator, and the number and length of electrode fingers included in the IDT electrodes and the reflectors are not limited to this.

As described above, the plurality of first acoustic wave resonators 31 include a substrate 320 with piezoelectricity and the IDT electrodes 41 to 45 on the substrate 320. The second acoustic wave resonator 61 includes the substrate 320 and the IDT electrode 71 on the substrate 320.

FIG. 2 illustrates the IDT electrode 71 and the second reflector 65 of the additional circuit 60, and the IDT electrode 45 and the first reflector 35 located on the additional circuit 60 side of the IDT electrodes 41 to 45 and the first reflectors 35 and 36 of the longitudinally coupled resonator 30.

The first reflector 35 and the second reflector 65 are provided at the respective outer side portions of the IDT electrode 71 in the propagation direction D1 of an acoustic wave. Further, the IDT electrode 45 is disposed on the opposite side of the IDT electrode 71 with respect to the first reflector 35 in the propagation direction D1 of an acoustic wave. That is, the IDT electrode 71 is at least partly overlapped with the IDT electrodes 41 to 45 when viewed from the propagation direction D1 of an acoustic wave.

As illustrated in the sectional view of FIG. 2, the acoustic wave filter 1 includes the substrate 320, an electrode layer 325 defining the IDT electrode 71 and the like, and a dielectric layer 326 provided on the substrate 320 to cover the electrode layer 325. Note that the stack structures of the IDT electrode 45, the first reflector 35, and the second reflector 65 are the same as the stack structure of the IDT electrode 71.

The substrate 320 is, for example, a lithium niobate substrate ($LiNbO_3$ substrate) with a cut-angle of about 127.5°. When a Rayleigh wave is used as an acoustic wave which propagates inside the substrate 320, the substrate 320 desirably has a cut-angle of about 120°±20° or about 300°±20°.

The electrode layer 325 has a structure including a plurality of metal layers stacked. The electrode layer 325 includes, for example, a Ti layer, an Al layer, a Ti layer, a Pt layer, and a NiCr layer stacked sequentially from the above.

The dielectric layer 326 is, for example, a film containing silicon dioxide ($SiO_2$) as its main component. The dielectric layer 326 is provided for the purpose of, for example, adjusting the frequency temperature characteristics of the IDT electrode 71, protecting the electrode layer 325 from an external environment, or increasing the moisture resistance.

As illustrated in the plan view of FIG. 2, the IDT electrode 71 includes the comb electrode 70a and the comb electrode 70b, which are a pair of comb electrodes that face each other.

The comb electrode 70a has a comb shape and includes a plurality of electrode fingers 76a parallel or substantially parallel to each other and a busbar electrode 77a configured to connect respective one ends of the plurality of electrode fingers 76a to each other. The comb electrode 70b has a comb shape and includes a plurality of electrode fingers 76b parallel or substantially parallel to each other and a busbar electrode 77b configured to connect respective one ends of the plurality of electrode fingers 76b to each other. The busbar electrodes 77a and 77b each extend along the propagation direction D1 of an acoustic wave. The plurality of electrode fingers 76a and 76b extend in an orthogonal direction D2 to the propagation direction D1 of an acoustic wave. The plurality of electrode fingers 76a and 76b are interdigitated with each other in the orthogonal direction D2 and face each other in the propagation direction D1 of an acoustic wave.

The comb electrode 70a is connected to the first terminal T1 through a lead-out wire on the second path r2. The other comb electrode 70b is connected to the ground through a lead-out wire different from the above-mentioned lead-out wire. Note that the ground may be an electrode for ground connection (not illustrated) provided on the substrate or the like of the acoustic wave filter 1. On the second path r2, a capacitive element (not illustrated) may be inserted in series.

The first reflector 35 and the second reflector 65 each include a plurality of electrode fingers ef parallel or substantially parallel to each other and a plurality of busbar electrodes eb configured to connect the respective ends of the plurality of electrode fingers ef to each other. The electrode fingers ef each extend in the orthogonal direction D2 to the propagation direction D1 of an acoustic wave. The busbar electrodes eb each extend in the propagation direction D1 of an acoustic wave. The number of the electrode fingers ef of the first reflector 35 is different from the number of the electrode fingers ef of the second reflector 65. However, the present invention is not limited to this, and the first reflector 35 and the second reflector 65 may include the same number of electrode fingers ef.

The additional circuit 60 prevents the output of an unwanted wave outside the pass band of the first filter circuit 10 from the acoustic wave filter 1 by applying the opposite phase to the unwanted wave. In the band outside the pass band of the first filter circuit 10, the additional circuit 60 and the first filter circuit 10 have opposite signal phases. In the above-mentioned acoustic wave filter 1, for example, by changing the number of the electrode fingers ef of the first reflector 35, the signal phase can be adjusted and the signal phase of the additional circuit 60 can be inverted. Further, in the acoustic wave filter 1, for example, the amplitude of a signal to be output from the additional circuit 60 can be changed by changing the number of the electrode fingers ef of the first reflector 35 or changing the intersecting width of the comb electrodes 70a and 70b.

For example, the acoustic wave filter 1 inverts the phases of some signals input from the second terminal T2 and excited by the longitudinally coupled resonator 30, extracts the signal by the additional circuit 60, and combines the extracted signal with an output signal from the first filter circuit 10 as a signal for canceling, thus being capable of canceling an unwanted wave. Further, the acoustic wave filter 1 inverts the phase of a signal input to the additional circuit 60 from the first terminal T1 through the connection node n1 and outputs the signal to the longitudinally coupled resonator 30 as a signal for canceling, thus being capable of canceling an unwanted wave generated in the first filter circuit 10.

Note that, in the present preferred embodiment, it is only necessary that the IDT electrode 71 is at least partly overlapped with the IDT electrodes 41 to 45 when viewed from the propagation direction D1 of an acoustic wave. For example, it is only necessary that about 50% or more of the IDT electrode 71 is overlapped with the IDT electrodes 41 to 45 when viewed from the propagation direction D1 of an acoustic wave. With this, the second acoustic wave resonator 61 can be acoustically coupled to the longitudinally coupled resonator 30 more efficiently. Further, the electrode fingers 76a and 76b of the IDT electrode 71 are not necessarily orthogonal to the propagation direction D1 of an acoustic wave. For example, the electrode fingers 76a and 76b may be inclined at an angle from about 0° or more to about 45° or less from the orthogonal direction D2 to the propagation direction D1 of an acoustic wave.

1-3. Effects, Etc

The bandpass characteristics and phase characteristics of the acoustic wave filter 1 are described with reference to FIG. 3 and FIG. 4.

Figure 3:
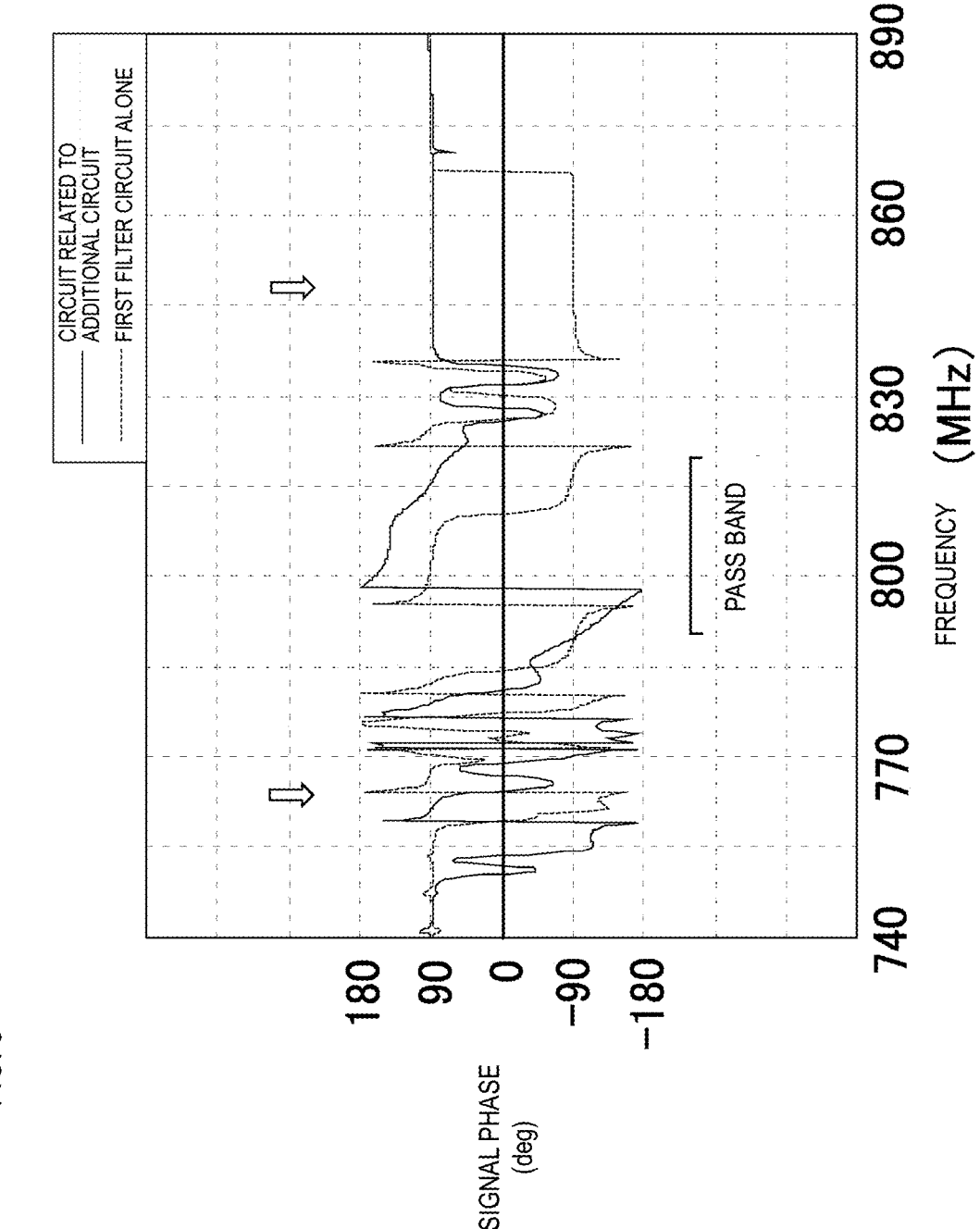
FIG. 3 is a diagram illustrating the phase characteristics of the acoustic wave filter according to Preferred Embodiment 1 of the present invention.

FIG. 3 is a diagram illustrating the phase characteristics of the acoustic wave filter 1. FIG. 4 is a diagram illustrating the bandpass characteristics of the acoustic wave filter 1. These diagrams illustrate an example in which the first filter circuit

10, that is, the acoustic wave filter 1 has a pass band from about 791 MHz to about 821 MHz.

In FIG. 3, the dashed line indicates the signal phase of the first filter circuit 10 alone, and the thin line indicates the signal phase of a circuit related to the additional circuit 60. The circuit related to the additional circuit 60 is a circuit including the longitudinally coupled resonator 30 and the additional circuit 60.

Figure 4:
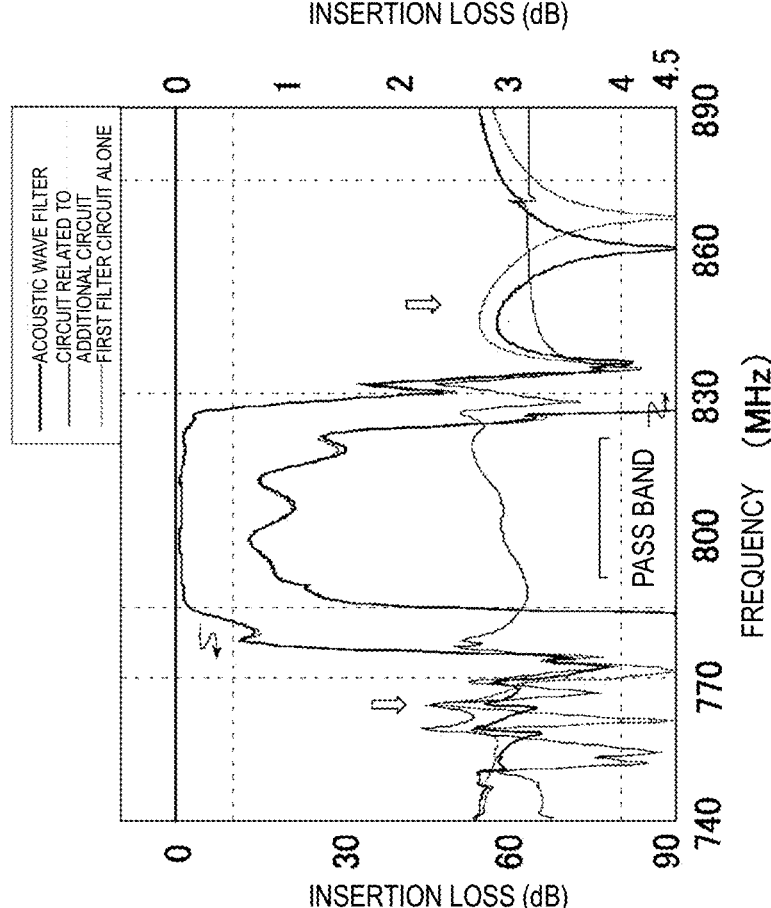
FIG. 4 is a diagram illustrating the bandpass characteristics of the acoustic wave filter according to Preferred Embodiment 1 of the present invention.

In FIG. 4, the dashed line indicates the insertion loss of the first filter circuit 10 alone. The thin line indicates the insertion loss of the circuit related to the additional circuit 60. The solid line indicates the insertion loss of the acoustic wave filter 1 and forms a waveform obtained by combining the dashed line and the thin line.

As illustrated in FIG. 3, the signal phase of the first filter circuit 10 alone drastically changes from positive to negative or from negative to positive near 765 MHz, which is on the low-frequency band side of the band outside the pass band. On the other hand, the signal phase of the circuit related to the additional circuit 60 is the opposite phase of the signal phase of the first filter circuit 10 to handle the drastic change in the signal phase of the first filter circuit 10 in the band outside the pass band.

In the acoustic wave filter 1, the output of an unwanted wave is prevented by combining this opposite-phase signal with the signal phase of the first filter circuit 10. For example, as illustrated in FIG. 4, near the frequency of 765 MHz, which is outside the pass band, while the first filter circuit 10 has an insertion loss of about 45 dB, the acoustic wave filter 1 has an insertion loss of about 55 dB. Further, near a frequency of 850 MHz, which is on the high-frequency band side of the band outside the pass band, while the first filter circuit 10 has an insertion loss of about 55 dB, the acoustic wave filter 1 has an insertion loss of about 59 dB.

In this way, with the acoustic wave filter 1 including the above-mentioned additional circuit 60, the peak level of an unwanted wave outside the pass band can be low. Further, in the acoustic wave filter 1, the peak level of an unwanted wave can be low not only on the low-frequency band side of the band outside the pass band but also on the high-frequency band side thereof. With this, attenuation outside the pass band of the acoustic wave filter 1 can be ensured.

1-4. Modification 1 of Preferred Embodiment 1

The configuration of the acoustic wave filter 1 according to Modification 1 of Preferred Embodiment 1 is described. In Modification 1, an example in which the second acoustic wave resonator 61 has a polarity opposite to that of Preferred Embodiment 1 is described.

Figure 5:
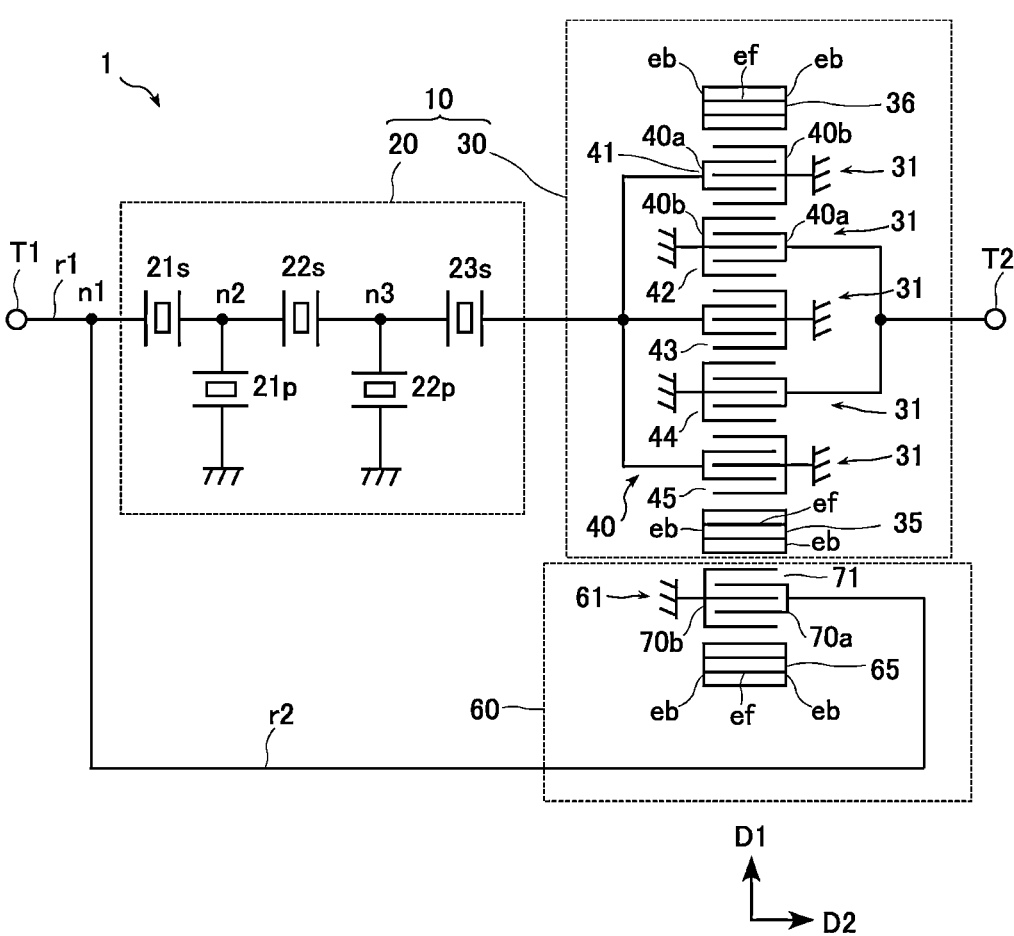
FIG. 5 is a circuit configuration diagram of an acoustic wave filter according to Modification 1 of Preferred Embodiment 1 of the present invention.

FIG. 5 is a circuit configuration diagram of the acoustic wave filter 1 according to Modification 1.

The acoustic wave filter 1 of Modification 1 includes the first filter circuit 10 including the ladder circuit 20 and the longitudinally coupled resonator 30, and the additional circuit 60 additionally connected to the first filter circuit 10. The first filter circuit 10 is the same as that of Preferred Embodiment 1, and a description thereof is thus omitted.

The additional circuit 60 includes the second acoustic wave resonator 61 and the second reflector 65. The second acoustic wave resonator 61 is disposed on the opposite side of the first acoustic wave resonators 31 with respect to the first reflector 35 in the propagation direction D1 of an acoustic wave. The second acoustic wave resonator 61 is acoustically coupled to the first acoustic wave resonators 31 with the first reflector 35 interposed therebetween. The second reflector 65 is disposed on the opposite side of the first reflector 35 with respect to the second acoustic wave resonator 61 in the propagation direction D1 of an acoustic wave.

The second acoustic wave resonator 61 includes a first end connected, through the second path r2, to a portion of the first path r1 located on the opposite side of the longitudinally coupled resonator 30 with respect to the predetermined series arm resonator 23s. The second acoustic wave resonator 61 includes a second end connected to the ground through a line that is different from the second path r2.

In the acoustic wave filter 1 of Modification 1, the polarity of the second acoustic wave resonator 61 is changed. For example, in Modification 1, in the orthogonal direction D2 to the propagation direction D1 of an acoustic wave, the comb electrode 70a and the other comb electrode 70b are in the reverse arrangement of that of Preferred Embodiment 1. Note that, in this example, although the comb electrodes 70a and 70b are in the reverse arrangement, as in Preferred Embodiment 1, the comb electrode 70a is connected to a portion of the first path r1 located between the first terminal T1 and the predetermined series arm resonator 23s, and the other comb electrode 70b is connected to the ground.

The acoustic wave filter 1 of Modification 1 also includes the above-mentioned additional circuit 60 so that attenuation outside the pass band of the acoustic wave filter 1 can be ensured.

1-5. Modification 2 of Preferred Embodiment 1

The configuration of the acoustic wave filter 1 according to Modification 2 of Preferred Embodiment 1 is described. In Modification 2, an example in which the additional circuit 60 includes a plurality of acoustic wave resonators is described.

Figure 6:
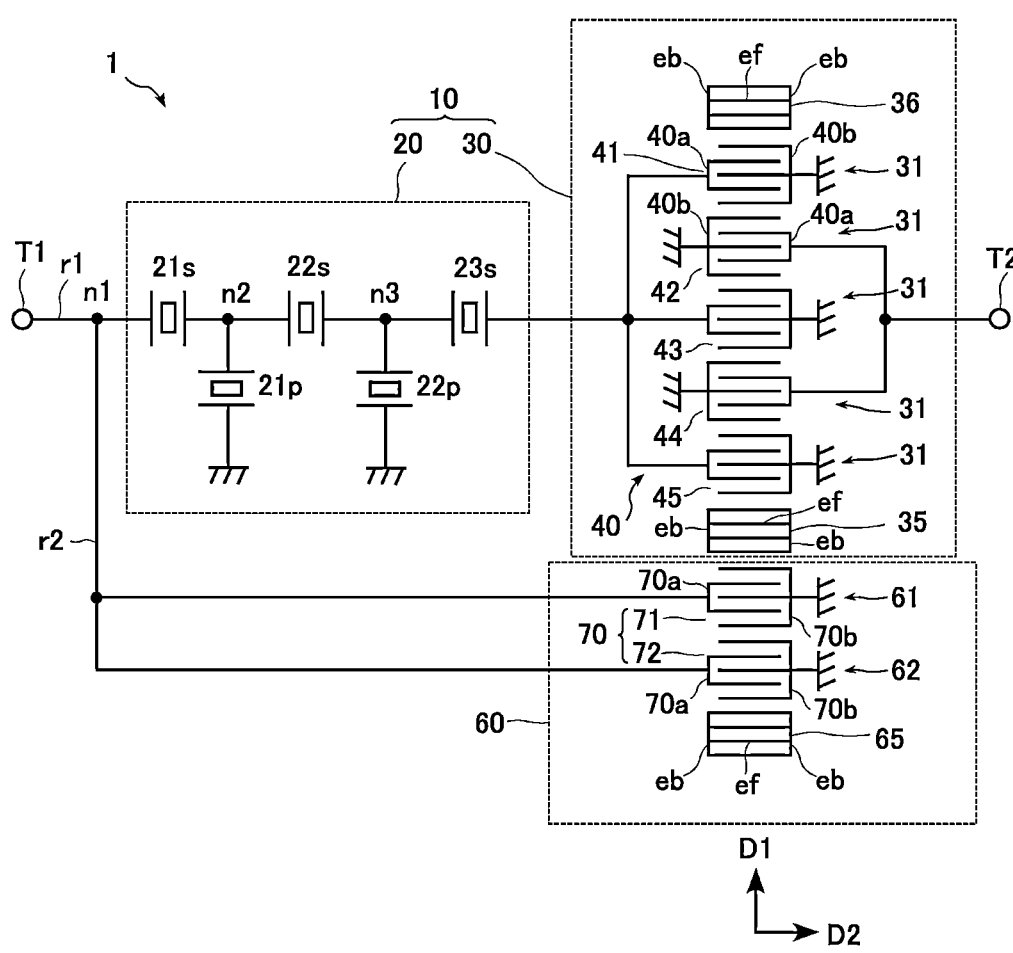
FIG. 6 is a circuit configuration diagram of an acoustic wave filter according to Modification 2 of Preferred Embodiment 1 of the present invention.

FIG. 6 is a circuit configuration diagram of the acoustic wave filter 1 according to Modification 2.

The acoustic wave filter 1 of Modification 2 includes the first filter circuit 10 including the ladder circuit 20 and the longitudinally coupled resonator 30, and the additional circuit 60 additionally connected to the first filter circuit 10. The first filter circuit 10 is the same as that of Preferred Embodiment 1, and a description thereof is thus omitted.

The additional circuit 60 includes a plurality of second acoustic wave resonators 61 and 62 and the second reflector 65.

The plurality of second acoustic wave resonators 61 and 62 are disposed on the opposite side of the first acoustic wave resonators 31 with respect to the first reflector 35 in the propagation direction D1 of an acoustic wave. The plurality of second acoustic wave resonators 61 and 62 are sequentially disposed along the propagation direction D1 of an acoustic wave. The second acoustic wave resonators 61 and 62 are acoustically coupled to the first acoustic wave resonators 31 with the first reflector 35 interposed therebetween. The second reflector 65 is disposed on the opposite side of the first reflector 35 with respect to the plurality of second acoustic wave resonators 61 and 62 in the propagation direction D1 of an acoustic wave.

The second acoustic wave resonators 61 and 62 include respective first ends connected to each other in the middle of the second path r2 and connected to a portion of the first path r1 located on the opposite side of the longitudinally coupled resonator 30 with respect to the predetermined series arm resonator 23s. The second acoustic wave resonators 61 and 62 each include a second end connected to the ground through a line that is different from the second path r2.

Specifically, the second acoustic wave resonators 61 and 62 include the substrate 320 and a plurality of IDT electrodes 71 and 72. That is, the additional circuit 60 includes an IDT electrode group 70 including the plurality of IDT electrodes 71 and 72.

The IDT electrodes 71 and 72 each include a plurality of comb electrodes 70a and 70b that face each other. The comb electrode 70a of each of the IDT electrodes 71 and 72 is connected to the connection node n1 on the first path r1, and the other comb electrode 70b is connected to the ground. Note that the comb electrode 70a is not necessarily connected to the connection node n1 and may be connected to the connection node n2 or n3.

The acoustic wave filter 1 of Modification 2 also includes the above-mentioned additional circuit 60 so that attenuation outside the pass band of the acoustic wave filter 1 can be ensured. Further, in the acoustic wave filter 1 of Modification 2, even when an unwanted wave generated in the first filter circuit 10 has a complex waveform, a signal waveform for canceling that handles the complex waveform can be generated by using the plurality of second acoustic wave resonators 61 and 62. For example, when there are two unwanted waves outside the pass band, opposite-phase waveforms that handle the two unwanted waves can be generated by using the second acoustic wave resonators 61 and 62. With this, the output of an unwanted wave from the acoustic wave filter 1 can be prevented so that attenuation outside the pass band of the acoustic wave filter 1 can be ensured.

1-6. Modification 3 of Preferred Embodiment 1

The configuration of the acoustic wave filter 1 according to Modification 3 of Preferred Embodiment 1 is described. In Modification 3, an example in which the polarity of the second acoustic wave resonator 61 of the plurality of second acoustic wave resonators 61 and 62 is reversed is described.

Figure 7:
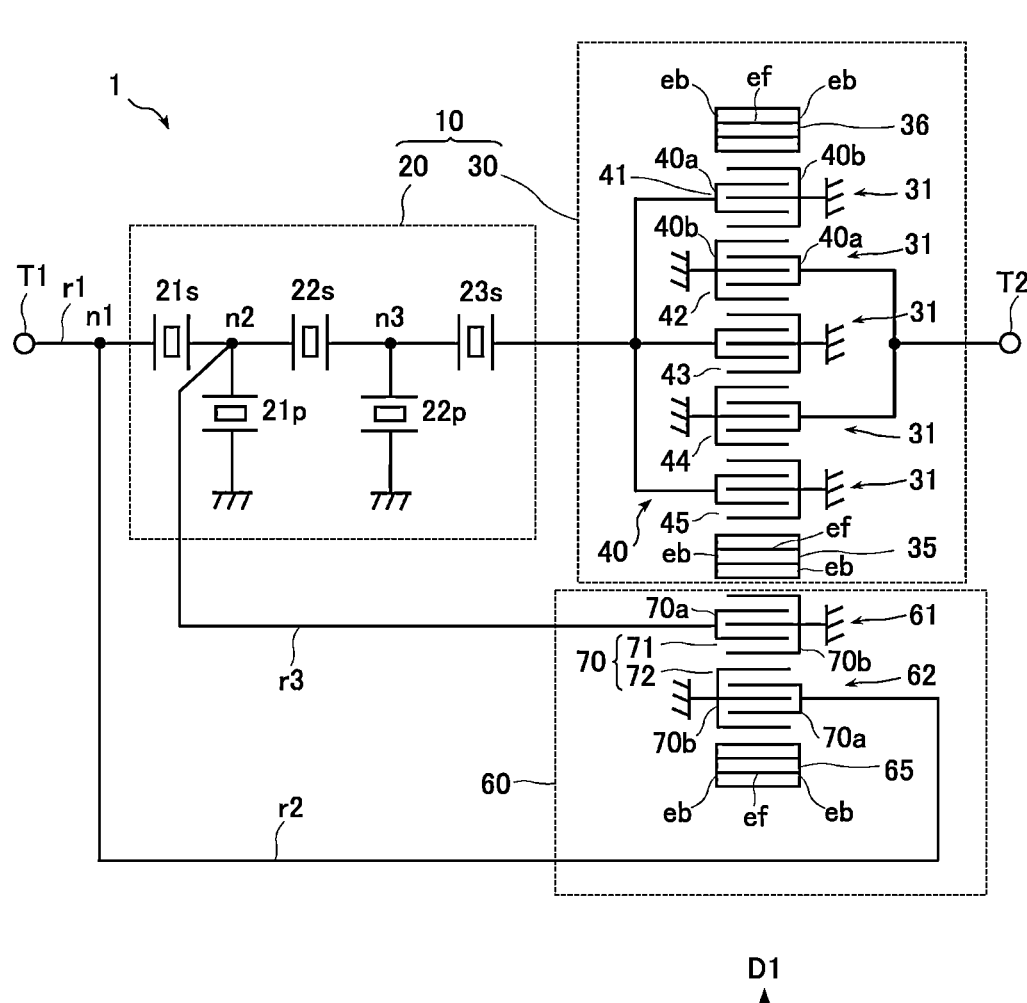
FIG. 7 is a circuit configuration diagram of an acoustic wave filter according to Modification 3 of Preferred Embodiment 1 of the present invention.

FIG. 7 is a circuit configuration diagram of the acoustic wave filter 1 according to Modification 3.

The acoustic wave filter 1 of Modification 3 includes the first filter circuit 10 including the ladder circuit 20 and the longitudinally coupled resonator 30, and the additional circuit 60 additionally connected to the first filter circuit 10. The first filter circuit 10 is the same as that of Preferred Embodiment 1, and a description thereof is thus omitted.

The additional circuit 60 includes the plurality of second acoustic wave resonators 61 and 62 and the second reflector 65.

The plurality of second acoustic wave resonators 61 and 62 are disposed on the opposite side of the first acoustic wave resonators 31 with respect to the first reflector 35 in the propagation direction D1 of an acoustic wave. The plurality of second acoustic wave resonators 61 and 62 are sequentially disposed along the propagation direction D1 of an acoustic wave. The second acoustic wave resonators 61 and 62 are acoustically coupled to the first acoustic wave resonators 31 with the first reflector 35 interposed therebetween. The second reflector 65 is disposed on the opposite side of the first reflector 35 with respect to the plurality of second acoustic wave resonators 61 and 62 in the propagation direction D1 of an acoustic wave.

The second acoustic wave resonator 61 includes a first end connected to the connection node n2 on the first path r1 through a third path r3 that is different from the second path r2. The second acoustic wave resonator 62 includes a first end connected to the connection node n1 on the first path r1 through the second path r2. The second acoustic wave resonators 61 and 62 include second ends connected to the ground. Note that the third path r3 is a path that connects the first path r1 to the ground. The second acoustic wave resonator 61 is provided on the third path r3 that connects the connection node n2 on the first path r1 to the ground. The first end of the second acoustic wave resonator 61 is not necessarily connected to the connection node n2 and may be connected to the connection node n1 or n3. The first end of the second acoustic wave resonator 62 is not necessarily connected to the connection node n1 and may be connected to the connection node n2 or n3.

In Modification 3, in the orthogonal direction D2 to the propagation direction D1 of an acoustic wave, the comb electrode 70a and the other comb electrode 70b of the second acoustic wave resonator 62 are in the reverse arrangement of that of Modification 2. Note that, in this example, although the comb electrodes 70a and 70b are in the reverse arrangement, as in Modification 2, the comb electrode 70a is connected to a portion of the first path r1 located between the first terminal T1 and the predetermined series arm resonator 23s, and the other comb electrode 70b is connected to the ground.

The acoustic wave filter 1 of Modification 3 also includes the above-mentioned additional circuit 60 so that attenuation outside the pass band of the acoustic wave filter 1 can be ensured. Further, in the acoustic wave filter 1 of Modification 3, even when an unwanted wave generated in the first filter circuit 10 has a complex waveform, a signal waveform for canceling that handles the complex waveform can be generated by using the plurality of second acoustic wave resonators 61 and 62. With this, the output of an unwanted wave from the acoustic wave filter 1 can be prevented so that attenuation outside the pass band of the acoustic wave filter 1 can be ensured.

1-7. Acoustic Wave Filter Related to Preferred Embodiment 1

The configuration of the acoustic wave filter 1 related to Preferred Embodiment 1 is described. In this example, a case where the additional circuit 60 is provided with a reactive element and a case where the additional circuit 60 is provided with no reactive element are described.

Figure 8:
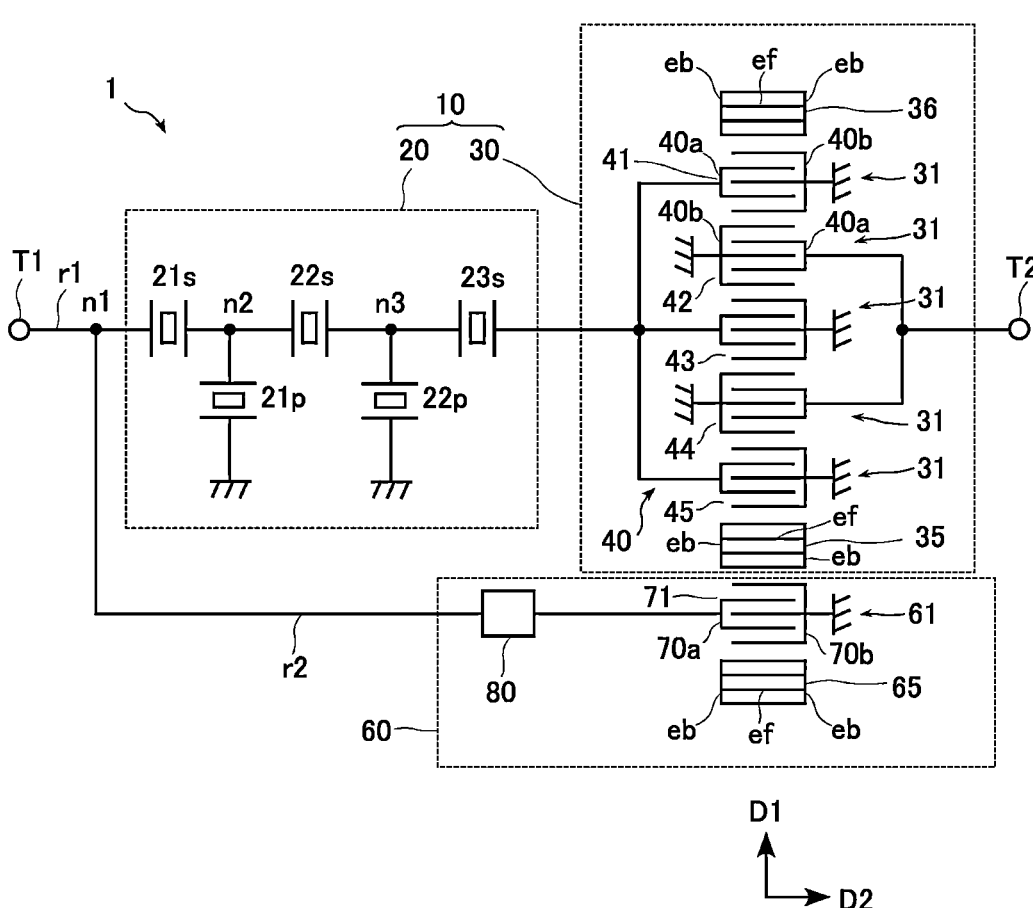
FIG. 8 is a circuit configuration diagram of an acoustic wave filter related to Preferred Embodiment 1 of the present invention.

FIG. 8 is a circuit configuration diagram of the acoustic wave filter 1 related to Preferred Embodiment 1.

The acoustic wave filter 1 includes the first filter circuit 10 including the ladder circuit 20 and the longitudinally coupled resonator 30, and the additional circuit 60 additionally connected to the first filter circuit 10.

The additional circuit 60 includes the second acoustic wave resonator 61, the second reflector 65, and a reactive element 80. The reactive element 80 is, for example, a capacitive element or an inductive element and is inserted in series on the second path r2.

Figure 9:
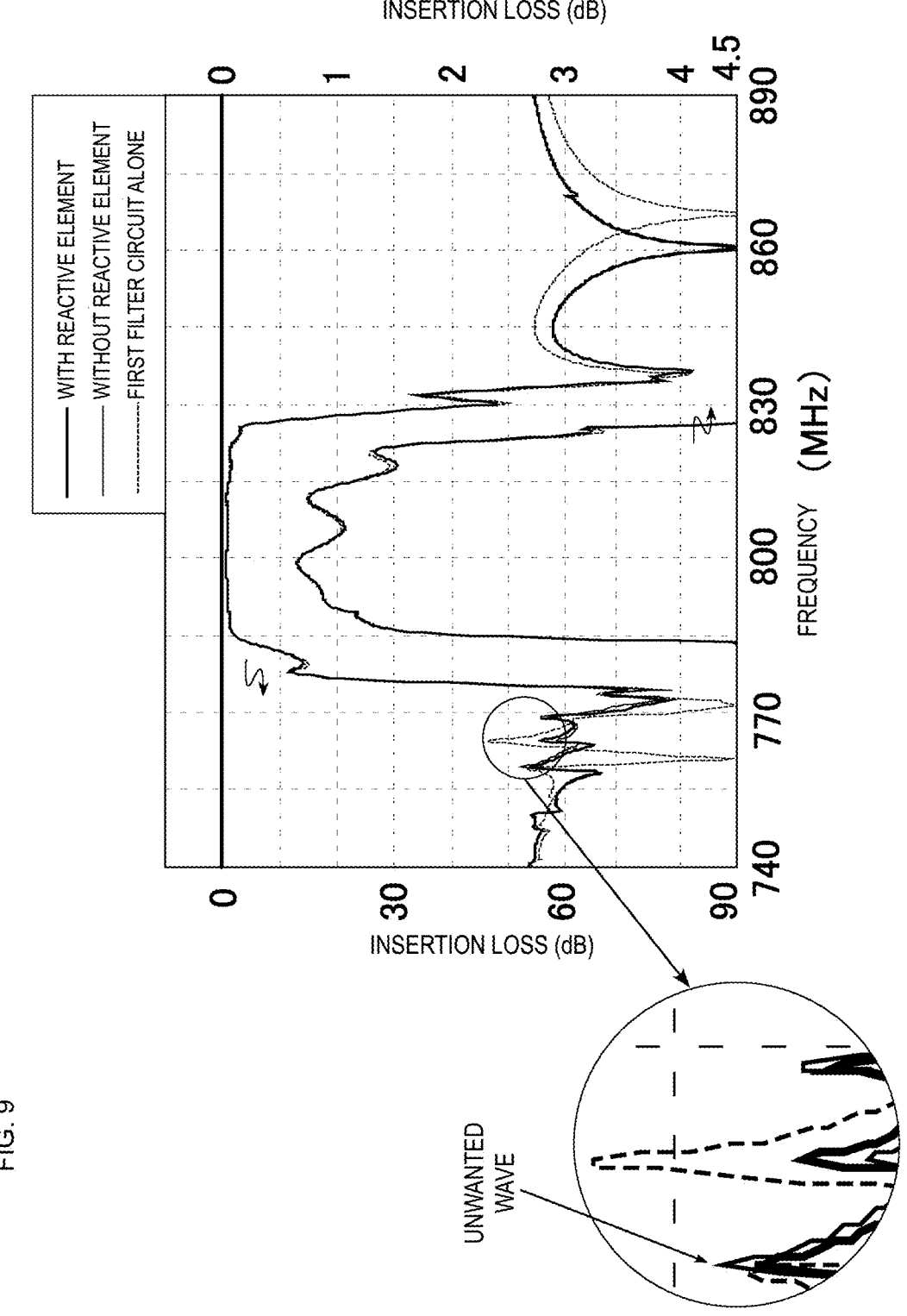
FIG. 9 is a diagram illustrating the bandpass characteristics of the acoustic wave filter related to Preferred Embodiment 1 of the present invention.

FIG. 9 is a diagram illustrating the bandpass characteristics of the acoustic wave filter 1. The characteristics illustrated in this diagram are obtained when a capacitive element is used as the reactive element 80.

In FIG. 9, the thin line indicates the insertion loss of the acoustic wave filter 1 when the additional circuit 60 includes no reactive element, and the solid line indicates the insertion loss of the acoustic wave filter 1 when the additional circuit 60 includes the reactive element 80. Further, the dashed line indicates the insertion loss of the first filter circuit 10 alone without the additional circuit 60.

As illustrated in FIG. 9, when the additional circuit 60 includes the reactive element 80, the generation of an unwanted wave outside the pass band can be reduced. For example, the peak level of an unwanted wave near a frequency of 760 MHz, which is outside the pass band, is lower than that in the case where no reactive element is provided. In this way, with the additional circuit 60 including the reactive element 80, greater attenuation outside the pass band of the acoustic wave filter 1 can be ensured. Further, with the additional circuit 60 including the reactive element 80, the amplitude of an opposite-phase signal for canceling can be finely adjusted and attenuation can thus be adjusted.

Note that even when the additional circuit 60 includes no reactive element, the generation of an unwanted wave outside the pass band is reduced as compared to the case of the first filter circuit 10 alone. Thus, even with the additional circuit 60 including no reactive element, attenuation outside the pass band of the acoustic wave filter 1 can be ensured.

1-8. Conclusion of Preferred Embodiment 1

As described above, the acoustic wave filter 1 according to the present preferred embodiment includes the first filter circuit 10 provided on the first path r1 that connects the first terminal T1 to the second terminal T2, and the additional circuit 60 connected to the first path r1. The first filter circuit 10 include: the one or more series arm resonators 21s to 23s, and the longitudinally coupled resonator 30 connected to the predetermined series arm resonator (for example, the series arm resonator 23s) of the one or more series arm resonators 21s to 23s. The longitudinally coupled resonator 30 includes the first acoustic wave resonator 31, and the first reflector 35 disposed in the propagation direction D1 of an acoustic wave excited by the first acoustic wave resonators 31 with respect to the first acoustic wave resonators 31. The additional circuit 60 includes the second acoustic wave resonator 61 disposed on the opposite side of the first acoustic wave resonators 31 with respect to the first reflector 35 in the propagation direction D1 of an acoustic wave. The second acoustic wave resonator 61 includes a first end connected to the first path r1 through the second path r2 that is different from the first path r1 and a second end connected to the ground. The above-mentioned predetermined series arm resonator 23s is connected to a portion of the first path r1 between the connection node n1 at which the second acoustic wave resonator 61 is connected to the first path r1 and the longitudinally coupled resonator 30.

In this way, with the additional circuit 60 including the above-mentioned second acoustic wave resonator 61, a signal waveform for canceling that handles the waveform of an unwanted wave generated in the first filter circuit 10 including the longitudinally coupled resonator 30 can be generated. Further, since the additional circuit 60 generates the above-mentioned signal waveform by using the acoustic wave of the longitudinally coupled resonator 30, even when the phase of an unwanted wave outside the pass band drastically changes, a signal waveform for canceling that handles the phase change can be generated. In the acoustic wave filter 1 of the present preferred embodiment, an unwanted wave is canceled by using this signal waveform for canceling so that attenuation outside the pass band can be ensured.

Further, the first acoustic wave resonator 31 and the second acoustic wave resonator 61 may each include the IDT electrode(s), and the IDT electrodes 41 to 45 of the first acoustic wave resonator 31 may be at least partly overlapped with the IDT electrode 71 of the second acoustic wave resonator 61 when viewed from the propagation direction D1 of an acoustic wave.

With this, the second acoustic wave resonator 61 can be acoustically coupled to the first acoustic wave resonators 31 efficiently, that is, the second acoustic wave resonator 61 can be acoustically coupled to the longitudinally coupled resonator 30 more efficiently. With this, an unwanted wave can be efficiently canceled by using a signal waveform for canceling so that attenuation outside the pass band can be ensured.

Further, the IDT electrode 71 of the second acoustic wave resonator 61 may include the plurality of comb electrodes 70*a* and 70*b* that face each other, the comb electrode 70*a* of the plurality of comb electrodes 70*a* and 70*b* may be connected to a portion of the first path r1 located on the opposite side of the longitudinally coupled resonator 30 with respect to the predetermined series arm resonator (series arm resonator 23*s*) through the second path r2, and the other comb electrode 70*b* may be connected to the ground.

In this way, with the comb electrode 70*a* of the second acoustic wave resonator 61 connected to the first path r1 and the other comb electrode 70*b* connected to the ground, a signal waveform for canceling that handles the waveform of an unwanted wave generated in the first filter circuit 10 can be appropriately generated. In the acoustic wave filter 1 of the present preferred embodiment, an unwanted wave is canceled by using this signal waveform for canceling so that attenuation outside the pass band can be ensured.

Further, the additional circuit 60 may include the second reflector 65 disposed on the opposite side of the first reflector 35 with respect to the second acoustic wave resonator 61 in the propagation direction D1 of an acoustic wave.

In this way, with the additional circuit 60 including the second reflector 65, the second acoustic wave resonator 61 can be acoustically coupled to the longitudinally coupled resonator 30 appropriately. With this, a signal waveform for canceling that handles the waveform of an unwanted wave generated in the first filter circuit 10 can be appropriately generated. In the acoustic wave filter 1 of the present preferred embodiment, an unwanted wave is canceled by using this signal waveform for canceling so that attenuation outside the pass band can be ensured.

Further, the additional circuit 60 may include the reactive element 80 provided on the second path r2.

With this, for example, the peak level of an unwanted wave can be low as compared to that in the acoustic wave filter 1 in which the additional circuit 60 does not include the reactive element 80. With this, greater attenuation outside the pass band of the acoustic wave filter 1 can be ensured.

Further, the additional circuit 60 may include the plurality of second acoustic wave resonators 61 and 62, and the plurality of second acoustic wave resonators 61 and 62 may be disposed on the opposite side of the first acoustic wave resonators 31 with respect to the first reflector 35 in the propagation direction D1 of an acoustic wave.

With this, even when an unwanted wave generated in the first filter circuit 10 has a complex waveform, a signal waveform for canceling that handles the complex waveform can be generated by using the plurality of second acoustic wave resonators 61 and 62. In the acoustic wave filter 1 of the present preferred embodiment, an unwanted wave is canceled by using this signal waveform for canceling so that attenuation outside the pass band can be ensured.

Further, the first filter circuit 10 may further include another resonator that is different from the one or more series arm resonators.

When the acoustic wave filter 1 includes another resonator, the amplitude of a signal is reduced when the signal passes through the resonator. Also in this case, however, for example, a signal waveform for canceling can be generated by taking the reduction in the amplitude of the signal into account, and an unwanted wave can be canceled by using this signal waveform. With this, attenuation outside the pass band can be ensured.

Preferred Embodiment 2

The configuration of an acoustic wave filter 1A according to Preferred Embodiment 2 is described. In Preferred Embodiment 2, an example in which second acoustic wave resonators 61 and 63 are provided at the respective outer side portions of the longitudinally coupled resonator 30 in the propagation direction D1 of an acoustic wave is described.

Figure 10:
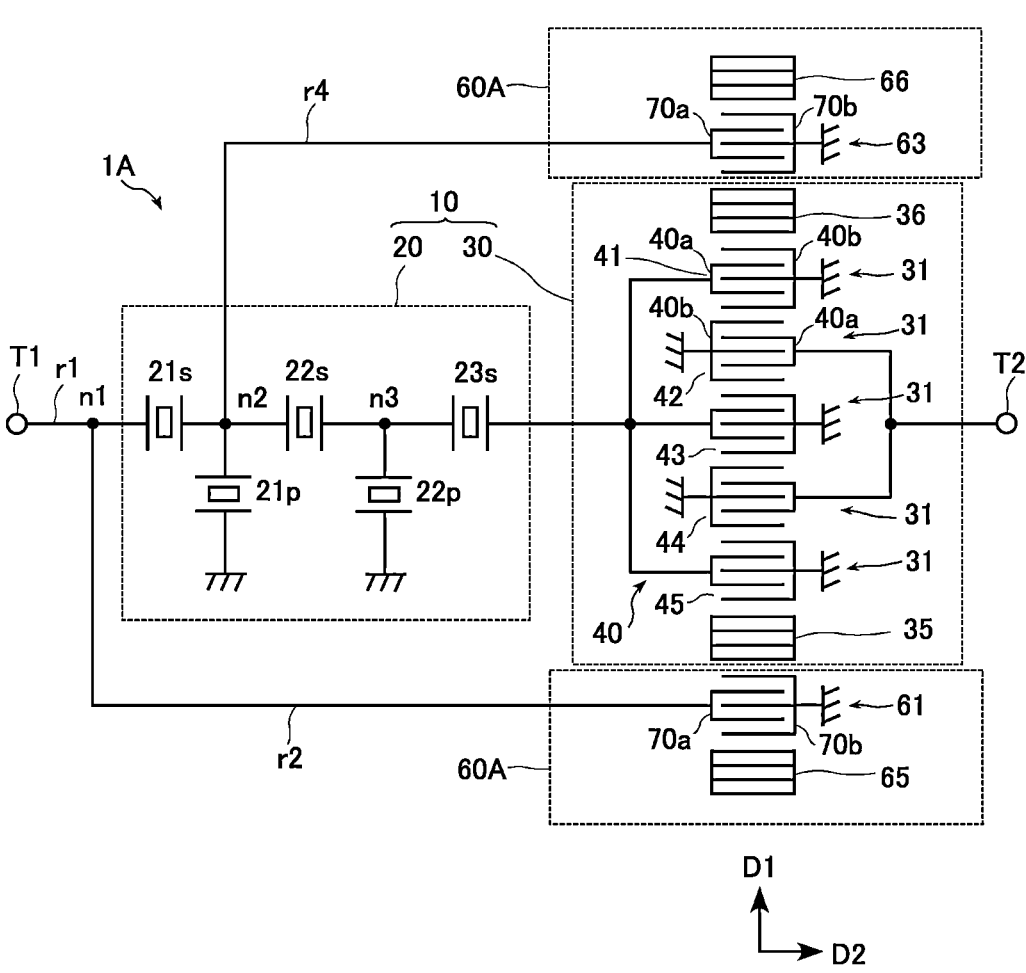
FIG. 10 is a circuit configuration diagram of an acoustic wave filter according to Preferred Embodiment 2 of the present invention.

FIG. 10 is a circuit configuration diagram of the acoustic wave filter 1A according to Preferred Embodiment 2.

The acoustic wave filter 1A is a band pass filter with a pass band that is a predetermined frequency band. As illustrated in FIG. 10, the acoustic wave filter 1A includes the first filter circuit 10 and additional circuits 60A additionally connected to the first filter circuit 10. Although the two additional circuits 60A are illustrated in FIG. 10, the additional circuits 60A are hereinafter collectively referred to as an additional circuit 60A.

The first filter circuit 10 is provided on the first path r1 that connects the first terminal T1 to the second terminal T2. The first filter circuit 10 is, for example, a reception filter or a transmission filter.

The first filter circuit 10 includes the ladder circuit 20 and the longitudinally coupled resonator 30 connected in series to the ladder circuit 20.

The ladder circuit 20 has a T-shaped ladder filter structure including the three series arm resonators 21*s* to 23*s* disposed on the first path r1 and the two parallel arm resonators 21*p* and 22*p* disposed on paths that connect the first path r1 to reference terminals.

The longitudinally coupled resonator 30 is a longitudinally coupled acoustic wave resonator including a plurality of acoustic wave resonators. The longitudinally coupled resonator 30 includes a first end connected to the predetermined series arm resonator 23*s* of the plurality of series arm resonators 21*s* to 23*s* and a second end connected to the second terminal T2.

The longitudinally coupled resonator 30 includes the plurality of first acoustic wave resonators 31 disposed along the propagation direction D1 of an acoustic wave. The longitudinally coupled resonator 30 includes the substrate 320 and the IDT electrode group 40 including the plurality of IDT electrodes 41, 42, 43, 44, and 45 disposed along the propagation direction D1 of an acoustic wave.

Further, the longitudinally coupled resonator 30 includes the plurality of first reflectors 35 and 36. The plurality of first reflectors 35 and 36 are disposed next to the IDT electrode group 40 in the propagation direction D1 of an acoustic wave. In the present preferred embodiment, the two first reflectors 35 and 36 are disposed at the respective outer side portions of the longitudinally coupled resonator 30 to sandwich the IDT electrode group 40.

The additional circuit 60A is a circuit for canceling an unwanted wave outside the pass band of the first filter circuit 10.

The additional circuits 60A include the plurality of second acoustic wave resonators 61 and 63 and a plurality of second reflectors 65 and 66.

The second acoustic wave resonator 61 is disposed on the opposite side of the first acoustic wave resonators 31 with respect to the first reflector 35 in the propagation direction D1 of an acoustic wave. The second acoustic wave resonator 61 is acoustically coupled to the first acoustic wave reso- nators 31 with the first reflector 35 interposed therebetween. The second reflector 65 is disposed on the opposite side of the first reflector 35 with respect to the second acoustic wave resonator 61 in the propagation direction D1 of an acoustic wave.

The second acoustic wave resonator 63 is disposed on the opposite side of the first acoustic wave resonators 31 with respect to the first reflector 36 in the propagation direction D1 of an acoustic wave. The second acoustic wave resonator 63 is acoustically coupled to the first acoustic wave reso- nators 31 with the first reflector 36 interposed therebetween. The second reflector 66 is disposed on the opposite side of the first reflector 36 with respect to the second acoustic wave resonator 63 in the propagation direction D1 of an acoustic wave.

The second acoustic wave resonator 61 includes a first end connected, through the second path r2, to a portion of the first path r1 located on the opposite side of the longitu- dinally coupled resonator 30 with respect to the predeter- mined series arm resonator 23s. That is, the predetermined series arm resonator (series arm resonator 23s) is connected to a portion of the first path r1 between the connection node n1 at which the second acoustic wave resonator 61 is connected to the first path r1 and the longitudinally coupled resonator 30. The second acoustic wave resonator 61 includes a second end connected to the ground through a line that is different from the second path r2. Specifically, the comb electrode 70a of the plurality of comb electrodes 70a and 70b is connected to the connection node n1 on the first path r1, and the other comb electrode 70b is connected to the ground.

The second acoustic wave resonator 63 includes a first end connected, through a fourth path r4, to a portion of the first path r1 located on the opposite side of the longitudinally coupled resonator 30 with respect to the predetermined series arm resonator 23s. That is, the predetermined series arm resonator (series arm resonator 23s) is connected to a portion of the first path r1 between the connection node n2 at which the second acoustic wave resonator 63 is connected to the first path r1 and the longitudinally coupled resonator 30. The second acoustic wave resonator 63 includes a second end connected to the ground through a line that is different from the fourth path r4. Specifically, the comb electrode 70a of the plurality of comb electrodes 70a and 70b is connected to the connection node n2 on the first path r1, and the other comb electrode 70b is connected to the ground. Note that the fourth path r4 is a path that connects the first path r1 to the ground. The second acoustic wave resonator 63 is provided on the fourth path r4 that connects the connection node n2 on the first path r1 to the ground. The comb electrode 70a of the second acoustic wave resonator 63 is not necessarily connected to the connection node n2 and may be connected to the connection node n1 or n3.

In this way, the additional circuit 60A of the acoustic wave filter 1A according to Preferred Embodiment 2 includes the plurality of second acoustic wave resonators 61 and 63. The plurality of second acoustic wave resonators 61 and 63 are provided at the respective outer side portions of the longitudinally coupled resonator 30 in the propagation direction D1 of an acoustic wave.

With this, even when an unwanted wave generated in the first filter circuit 10 has a complex waveform, a signal waveform for canceling that handles the complex waveform can be generated by using the plurality of second acoustic wave resonators 61 and 63. In the acoustic wave filter 1A of the present preferred embodiment, an unwanted wave is canceled by using this signal waveform for canceling so that attenuation outside the pass band can be ensured.

Preferred Embodiment 3

The configuration of an acoustic wave filter 1B according to Preferred Embodiment 3 is described. In Preferred Embodiment 3, an example in which the second acoustic wave resonator 61 is provided between a plurality of first acoustic wave resonators 31 and 32 is described.

Figure 11:
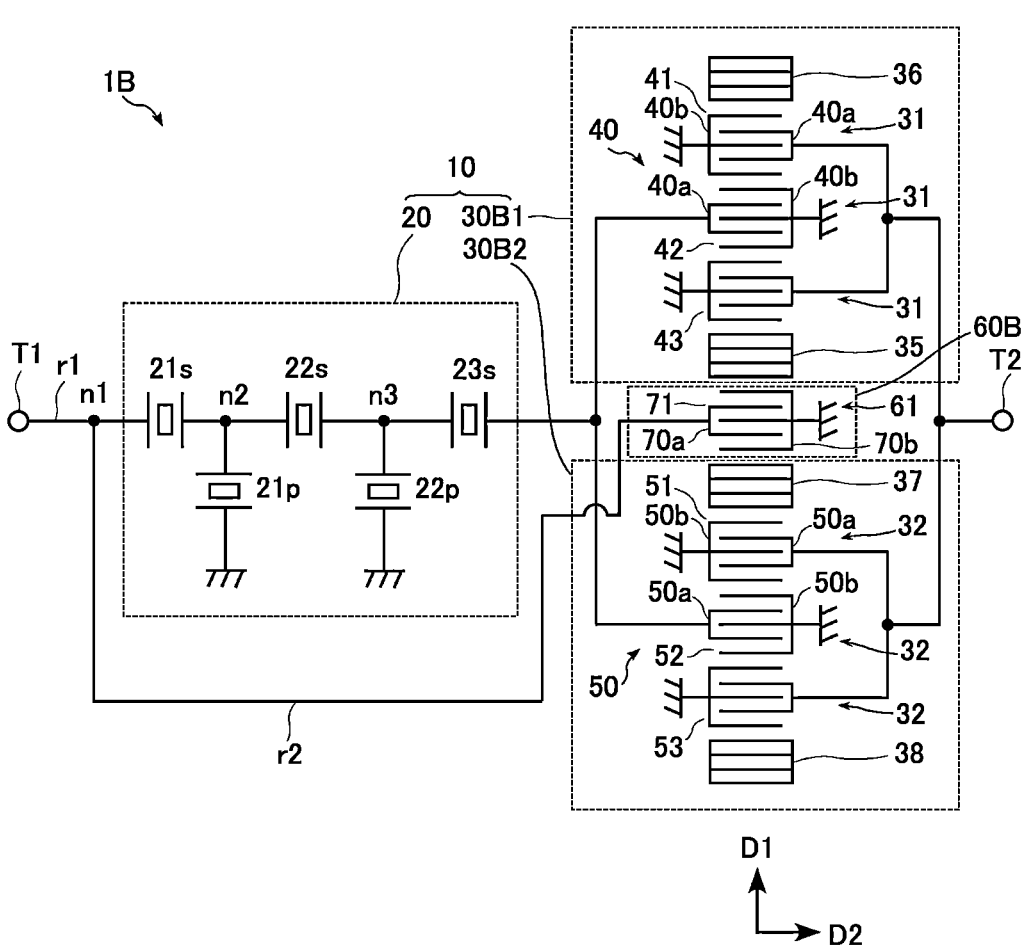
FIG. 11 is a circuit configuration diagram of an acoustic wave filter according to Preferred Embodiment 3 of the present invention.

FIG. 11 is a circuit configuration diagram of the acoustic wave filter 1B according to Preferred Embodiment 3.

The acoustic wave filter 1B is a band pass filter with a pass band that is a predetermined frequency band. As illustrated in FIG. 11, the acoustic wave filter 1B includes the first filter circuit 10 and an additional circuit 60B additionally con- nected to the first filter circuit 10.

The first filter circuit 10 is provided on the first path r1 that connects the first terminal T1 to the second terminal T2. The first filter circuit 10 is, for example, a reception filter or a transmission filter.

The first filter circuit 10 includes the ladder circuit 20 and a plurality of longitudinally coupled resonators 30B1 and 30B2 connected in series to the ladder circuit 20.

The ladder circuit 20 has a T-shaped ladder filter structure including the three series arm resonators 21s to 23s disposed on the first path r1 and the two parallel arm resonators 21p and 22p disposed on paths that connect the first path r1 to reference terminals.

The plurality of longitudinally coupled resonators 30B1 and 30B2 are connected in parallel to each other. The plurality of longitudinally coupled resonators 30B1 and 30B2 are provided at a portion of the first path r1 between the ladder circuit 20 and the second terminal T2.

The longitudinally coupled resonator 30B1 includes the plurality of first acoustic wave resonators 31, and the lon- gitudinally coupled resonator 30B2 includes the plurality of first acoustic wave resonators 32. The longitudinally coupled resonators 30B1 and 30B2 each have one end connected to the predetermined series arm resonator 23s of the plurality of series arm resonators 21s to 23s and a second end connected to the second terminal T2.

The longitudinally coupled resonator 30B1 includes the plurality of first acoustic wave resonators 31 disposed along the propagation direction D1 of an acoustic wave. The longitudinally coupled resonator 30B2 includes the plurality of first acoustic wave resonators 32 disposed along the propagation direction D1 of an acoustic wave. The plurality of first acoustic wave resonators 31 and 32 are connected in parallel to each other.

The first acoustic wave resonators 31 and 32 are, for example, resonators that use surface acoustic waves and include the substrate 320 with piezoelectricity and IDT electrodes. The longitudinally coupled resonator 30B1 includes the IDT electrode group 40 including the plurality of IDT electrodes 41, 42, and 43 disposed along the propa- gation direction D1 of an acoustic wave. The longitudinally coupled resonator 30B2 includes an IDT electrode group 50 including a plurality of IDT electrodes 51, 52, and 53 disposed along the propagation direction D1 of an acoustic wave. The IDT electrode groups 40 and 50 are disposed along the propagation direction D1 of an acoustic wave.

The IDT electrodes 41 to 43 each include the plurality of comb electrodes 40a and 40b that face each other. Here, of the plurality of comb electrodes 40a and 40b, the comb electrode connected to the signal path is referred to as a comb electrode 40a and the comb electrode connected to the ground is referred to as the other comb electrode 40b.

The IDT electrodes 51 to 53 each include a plurality of comb electrodes 50a and 50b that face each other. Here, of the plurality of comb electrodes 50a and 50b, the comb electrode connected to the signal path is referred to as a comb electrode 50a and the comb electrode connected to the ground is referred to as the other comb electrode 50b.

The comb electrode 40a of the IDT electrode 42 and the comb electrode 50a of the IDT electrode 52 are connected in parallel to each other and connected to the ladder circuit 20. The other comb electrodes 40b and 50b are each connected to the ground. The comb electrodes 40a of the IDT electrodes 41 and 43 and the comb electrodes 50a of the IDT electrodes 51 and 53 are connected in parallel to each other and connected to the second terminal T2. The other comb electrodes 40b and 50b are each connected to the ground.

Further, the longitudinally coupled resonator 30B1 includes the plurality of first reflectors 35 and 36, and the longitudinally coupled resonator 30B2 includes a plurality of first reflectors 37 and 38. The plurality of first reflectors 35 and 36 are disposed next to the IDT electrode group 40 in the propagation direction D1 of an acoustic wave. In the present preferred embodiment, the two first reflectors 35 and 36 are disposed at the respective outer side portions of the IDT electrode group 40 to sandwich the IDT electrode group 40. The plurality of first reflectors 37 and 38 are disposed next to the IDT electrode group 50 in the propagation direction D1 of an acoustic wave. In the present preferred embodiment, the two first reflectors 37 and 38 are disposed at the respective outer side portions of the IDT electrode group 50 to sandwich the IDT electrode group 50.

The additional circuit 60B is a circuit for canceling an unwanted wave outside the pass band of the first filter circuit 10.

The additional circuit 60B includes the second acoustic wave resonator 61. The additional circuit 60B is provided between the plurality of first acoustic wave resonators 31 and the plurality of first acoustic wave resonators 32 in the propagation direction D1 of an acoustic wave.

The second acoustic wave resonator 61 is disposed on the opposite side of the first acoustic wave resonators 31 with respect to the first reflector 35 in the propagation direction D1 of an acoustic wave. The second acoustic wave resonator 61 is acoustically coupled to the first acoustic wave resonators 31 with the first reflector 35 interposed therebetween. Further, the second acoustic wave resonator 61 is disposed on the opposite side of the first acoustic wave resonators 32 with respect to the first reflector 37 in the propagation direction D1 of an acoustic wave. The second acoustic wave resonator 61 is acoustically coupled to the first acoustic wave resonators 32 with the first reflector 37 interposed therebetween. The plurality of first reflectors 35 and 37 are disposed at the respective outer side portions of the second acoustic wave resonator 61 to sandwich the second acoustic wave resonator 61 in the propagation direction D1 of an acoustic wave.

The second acoustic wave resonator 61 includes a first end connected, through the second path r2, to the connection node n1 on the first path r1, which is located on the opposite side of the longitudinally coupled resonators 30B1 and 30B2 with respect to the predetermined series arm resonator 23s. That is, the predetermined series arm resonator (series arm resonator 23s) is connected to a portion of the first path r1 between the connection node n1 at which the second acoustic wave resonator 61 is connected to the first path r1 and the longitudinally coupled resonators 30B1 and 30B2. The second acoustic wave resonator 61 includes a second end connected to the ground through a line that is different from the second path r2.

In this way, the longitudinally coupled resonators 30B1 and 30B2 of the acoustic wave filter 1B according to Preferred Embodiment 3 include the plurality of first acoustic wave resonators 31 and 32 connected in parallel. The additional circuit 60B is provided between the plurality of first acoustic wave resonators 31 and 32 in the propagation direction D1 of an acoustic wave.

With this, a signal waveform for canceling can be generated by using the acoustic waves of the plurality of first acoustic wave resonators 31 and 32. In the acoustic wave filter 1B of the present preferred embodiment, an unwanted wave is canceled by using this signal waveform for canceling so that attenuation outside the pass band can be ensured.

Preferred Embodiment 4

The configuration of a multiplexer 5 according to Preferred Embodiment 4 is described with reference to FIG. 12. Note that, in Preferred Embodiment 4, the acoustic wave filter 1 out of the acoustic wave filters 1 to 1B is described as an example.

Figure 12:
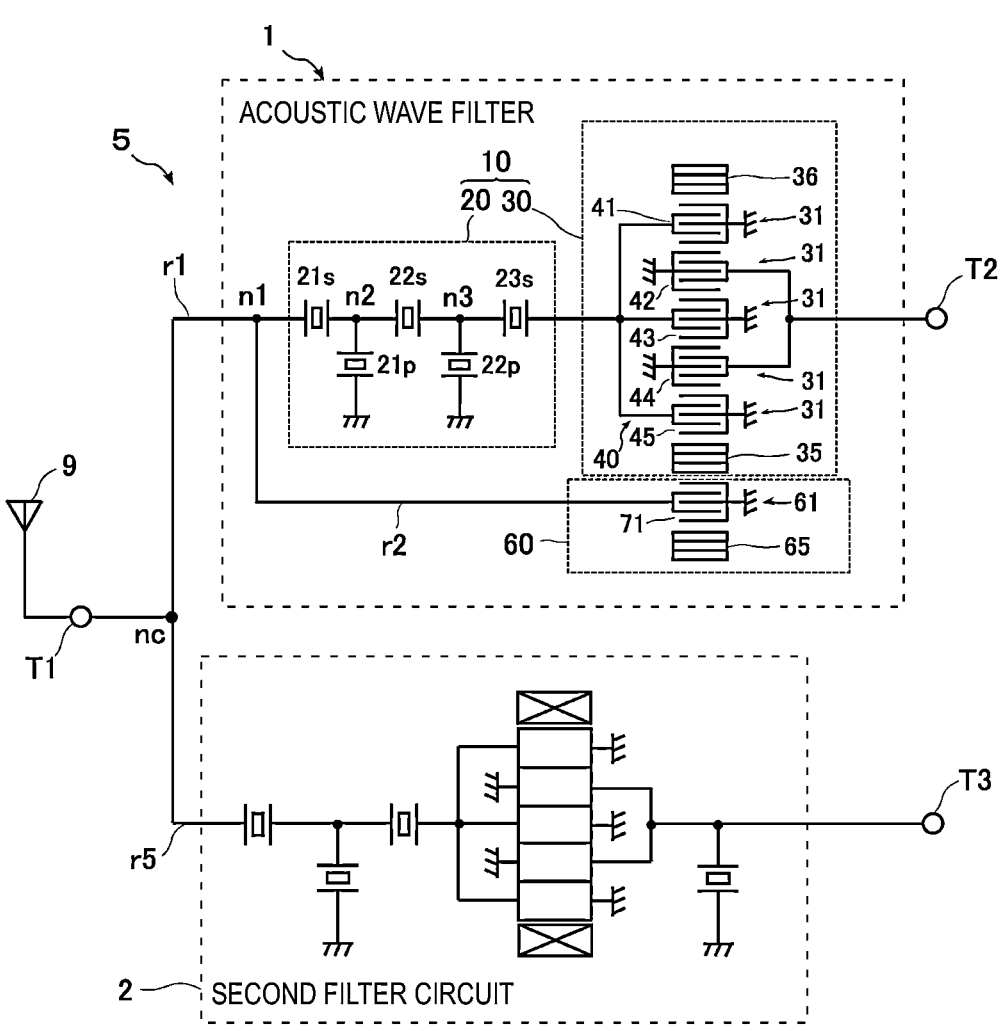
FIG. 12 is a circuit configuration diagram of a multiplexer according to Preferred Embodiment 4 of the present invention.

FIG. 12 is a circuit configuration diagram of the multiplexer 5 according to the Preferred Embodiment 4. Note that FIG. 12 also illustrates an antenna element 9.

The multiplexer 5 is a demultiplexer or multiplexer including a plurality of filters. The multiplexer 5 includes the acoustic wave filter 1 and a second filter circuit 2 that is different from the acoustic wave filter 1.

Further, the multiplexer 5 includes the first terminal T1, the second terminal T2, and a third terminal T3.

The first terminal T1 is a common terminal connected to each of the acoustic wave filter 1 and the second filter circuit 2. Specifically, the first terminal T1 is connected to the acoustic wave filter 1 through a common connection point nc between the acoustic wave filter 1 and the first terminal T1 and connected to the second filter circuit 2 through the common connection point nc. Further, the first terminal T1 is connected to the antenna element 9 outside the multiplexer 5. The first terminal T1 also serves as the antenna terminal of the multiplexer 5.

The second terminal T2 is connected to the acoustic wave filter 1. Further, the second terminal T2 is connected to an RF signal processing circuit (not illustrated) outside the multiplexer 5 with an amplifier circuit or the like (not illustrated) interposed therebetween.

The third terminal T3 is connected to the second filter circuit 2. Further, the third terminal T3 is connected to an RF signal processing circuit (not illustrated) outside the multiplexer 5 with an amplifier circuit or the like (not illustrated) interposed therebetween.

The acoustic wave filter 1 is disposed on the first path r1 that connects the first terminal T1 to the second terminal T2. The acoustic wave filter 1 is, for example, a reception filter with a pass band that is a downlink frequency band (reception band) and is set to have a pass band higher than that of the second filter circuit 2. The pass band of the acoustic wave filter 1 is the same as the pass band of the first filter circuit 10.

The second filter circuit 2 is disposed on a fifth path r5 that connects the first terminal T1 to the third terminal T3. The second filter circuit 2 has a pass band that is a frequency band different from the pass band of the first filter circuit 10. The second filter circuit 2 is, for example, a transmission filter with a pass band that is an uplink frequency band (transmission band). The second filter circuit 2 includes, for example, a plurality of series arm resonators, a plurality of parallel arm resonators, and a longitudinally coupled acoustic wave resonator.

The acoustic wave filter 1 and the second filter circuit 2 are each required to have characteristics that make the acoustic wave filter 1 or the second filter circuit 2 allow a frequency in its own band to pass therethrough and attenuate a frequency in the band of the other filter, which is located outside its own band.

The multiplexer 5 according to the present preferred embodiment includes the acoustic wave filter 1 and the second filter circuit 2 that is different from the acoustic wave filter 1. The acoustic wave filter 1 is connected to the second filter circuit 2 through the common connection point nc. On the first path r1, the connection node n1 at which the second acoustic wave resonator 61 is connected to the first path r1 is closer to the common connection point nc than the connection node n3 at which the predetermined series arm resonator (for example, the series arm resonator 23s) is connected to the first path r1 is. That is, on the first path r1, the connection node n1 is closer to the first terminal T1, which is a common terminal, than the connection node n3.

With this, the multiplexer 5 including the acoustic wave filter 1 configured to ensure attenuation outside the pass band can be provided. Note that although the acoustic wave filter 1 has been described above as a representative example, the multiplexer 5 may include the acoustic wave filter 1A or 1B instead of the acoustic wave filter 1.

Further, the additional circuit 60 and the first filter circuit 10 of the acoustic wave filter 1 may have opposite signal phases in the pass band of the second filter circuit 2.

With this, an opposite-phase signal waveform that handles the waveform of an unwanted wave generated in the first filter circuit 10 can be generated. Further, since the additional circuit 60 generates a signal waveform by using the acoustic wave of the longitudinally coupled resonator 30, even when the phase of an unwanted wave outside the pass band drastically changes, an opposite-phase signal waveform that follows the phase change can be generated. Thus, in the multiplexer 5, an unwanted wave is canceled by using this opposite-phase signal waveform so that attenuation in the pass band of the second filter circuit 2 can be ensured in the acoustic wave filter 1.

Preferred Embodiment 5

The configuration of an acoustic wave filter 1C according to Preferred Embodiment 5 is described. In Preferred Embodiment 5, an example in which the second acoustic wave resonator 64 of the plurality of second acoustic wave resonators 61 and 64 is connected to a portion of the first path r1 on the second terminal T2 side is described.

Figure 13:
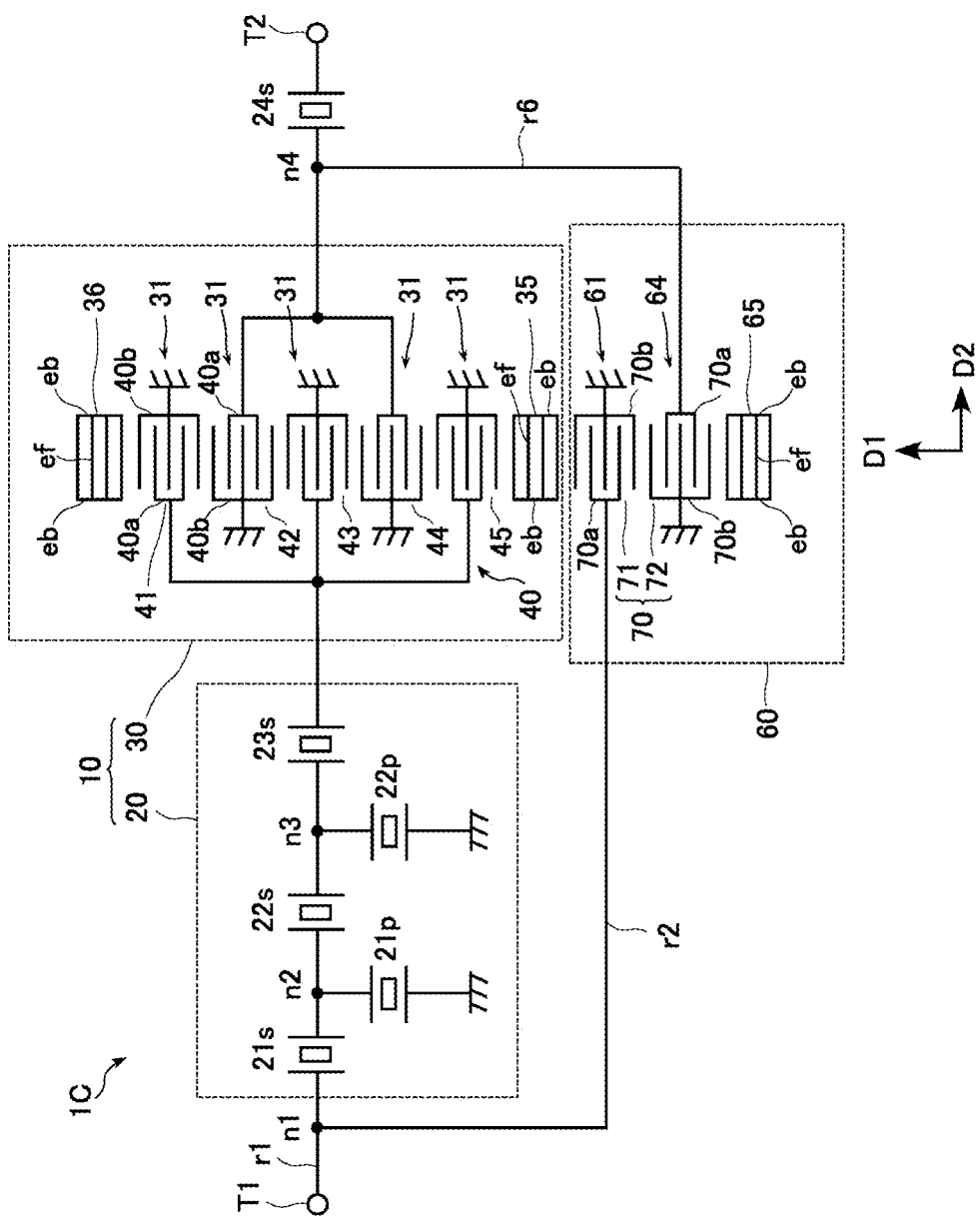
FIG. 13 is a circuit configuration diagram of an acoustic wave filter according to Preferred Embodiment 5 of the present invention.

FIG. 13 is a circuit configuration diagram of the acoustic wave filter 1C according to Preferred Embodiment 5.

The acoustic wave filter 1C of Preferred Embodiment 5 includes the first filter circuit 10 including the ladder circuit 20 and the longitudinally coupled resonator 30, and the additional circuit 60 additionally connected to the first filter circuit 10.

The first filter circuit 10 includes the ladder circuit 20 and the longitudinally coupled resonator 30 connected in series to the ladder circuit 20.

The ladder circuit 20 has a T-shaped ladder filter structure including four series arm resonators 21s to 24s disposed on the first path r1 and the two parallel arm resonators 21p and 22p disposed on paths that connect the first path r1 to reference terminals.

The longitudinally coupled resonator 30 includes a first end connected to the predetermined series arm resonator 23s of the plurality of series arm resonators 21s to 23s and a second end connected to the series arm resonator 24s. The series arm resonator 24s includes a first end connected to the longitudinally coupled resonator 30 and a second end connected to the second terminal T2.

The additional circuit 60 includes the plurality of second acoustic wave resonators 61 and 64 and the second reflector 65.

The plurality of second acoustic wave resonators 61 and 64 are disposed on the opposite side of the first acoustic wave resonators 31 with respect to the first reflector 35 in the propagation direction D1 of an acoustic wave. The plurality of second acoustic wave resonators 61 and 64 are sequentially disposed along the propagation direction D1 of an acoustic wave. The second acoustic wave resonators 61 and 64 are acoustically coupled to the first acoustic wave resonators 31 with the first reflector 35 interposed therebetween. The second reflector 65 is disposed on the opposite side of the first reflector 35 with respect to the plurality of second acoustic wave resonators 61 and 64 in the propagation direction D1 of an acoustic wave.

The second acoustic wave resonator 61 includes a first end connected to the connection node n1 on the first terminal T1 side on the first path r1 through the second path r2. The second acoustic wave resonator 61 includes a second end connected to the ground through the second path r2. The second acoustic wave resonator 64 includes a first end connected to a connection node n4 on the second terminal T2 side on the first path r1 through a sixth path r6 that is different from the second path. The connection node n4 is a node between the series arm resonator 24s and the second terminal T2. The second acoustic wave resonator 64 includes a second end connected to the ground through the sixth path r6. Note that the sixth path r6 is a path that connects the first path r1 to the ground. That is, the second acoustic wave resonator 64 is provided on the sixth path r6 that connects the connection node n4 on the first path r1 to the ground.

In Preferred Embodiment 5, the second acoustic wave resonator 61 of the plurality of second acoustic wave resonators includes a first end connected to a portion of the first path r1 on the first terminal T1 side (the first terminal T1 side with respect to the longitudinally coupled resonator 30) and a second end connected to the ground. The other second acoustic wave resonator 64 that is different from the second acoustic wave resonator 61 includes a first end connected to a portion of the first path r1 on the second terminal T2 side (the second terminal T2 side with respect to the longitudinally coupled resonator 30) and a second end connected to the ground.

With the acoustic wave filter 1C, attenuation outside the pass band of the acoustic wave filter 1C can be ensured. Further, in the acoustic wave filter 1C, even when an unwanted wave generated in the first filter circuit 10 has a complex waveform, a signal waveform for canceling that handles the complex waveform can be generated by using the plurality of second acoustic wave resonators 61 and 64. With this, the output of an unwanted wave from the acoustic wave filter 1C can be prevented so that attenuation outside the pass band of the acoustic wave filter 1C can be ensured.

Note that although the example in which the ladder circuit 20 includes the four series arm resonators 21s to 24s and the two parallel arm resonators 21p and 22p has been described above, the present invention is not necessarily limited to this. For example, the ladder circuit 20 may include a parallel arm resonator connected between the series arm resonator 24s and the connection node n4 on the first path r1. Further, the series arm resonator 24s is not necessarily provided between the longitudinally coupled resonator 30 on the first path r1 and the second terminal T2.

Other Preferred Embodiments

Although the acoustic wave filters and multiplexers according to the preferred embodiments of the present invention have been described above with reference to the preferred embodiments, the present invention also includes other preferred embodiments implemented by combining optionally selected components of the above-mentioned preferred embodiments, modifications implemented by applying, to the above-mentioned preferred embodiments, various modifications conceived of by a person skilled in the art without deviating from the gist of the present invention, and high-frequency front-end circuits and communication devices including the acoustic wave filters or multiplexers according to preferred embodiments of the present invention.

The examples in which the additional circuit includes the one or two second acoustic wave resonators have been described above. The present invention is, however, not limited to this, and the additional circuit may include three or more second acoustic wave resonators.

Further, the number of the series arm resonators and parallel arm resonators of the ladder circuit 20 is not limited to three or two, and it is only necessary that the ladder circuit 20 includes two or more series arm resonators and one or more parallel arm resonators. Further, the parallel arm resonators may be connected to the reference terminals with inductors interposed therebetween. Further, although the parallel arm resonators are each connected to the ground in FIG. 1, the parallel arm resonators may be connected to a common ground. Whether to use a common reference terminal or individual reference terminals may be appropriately selected based on constraints imposed by the mounting layout of the ladder circuit 20, for example.

Further, the first terminal T1 and the second terminal T2 may be any of an input terminal and an output terminal. For example, when the first terminal T1 is an input terminal, the second terminal T2 is an output terminal. When the second terminal T2 is an input terminal, the first terminal T1 is an output terminal.

Further, the materials of the electrode layer 325, which defines the IDT electrodes and the reflectors, and the dielectric layer 326 are not limited to the materials described above. Further, the IDT electrodes do not necessarily have the above-mentioned stack structure. The IDT electrodes may be made of, for example, metals such as Ti, Al, Cu, Pt, Au, Ag, or Pd or an alloy thereof. Further, the IDT electrodes may include a plurality of multilayer bodies made of the above-mentioned metals or an alloy thereof.

Further, although the substrate with piezoelectricity has been described as the substrate 320 in the preferred embodiments, the substrate in question may be a piezoelectric substrate including a single piezoelectric layer. The piezoelectric substrate in this case is made of, for example, a piezoelectric single crystal of $LiTaO_3$ or another piezoelectric single crystal such as $LiNbO_3$. Further, as long as the substrate 320, on which the IDT electrodes are formed, has piezoelectricity, a structure only including a piezoelectric layer or a structure including a support substrate and a piezoelectric layer stacked thereon may be used as the substrate 320. Further, the cut-angle of the substrate 320 according to the above-mentioned preferred embodiments is not limited. That is, the stack structure, the material, and the thickness may be appropriately changed depending on the required bandpass characteristics or the like of an acoustic wave filter, and similar effects can be provided even with a surface acoustic wave filter using a $LiTaO_3$ piezoelectric substrate, $LiNbO_3$ piezoelectric substrate, or the like having a cut-angle other than the cut-angles described in the above-mentioned preferred embodiments.

Preferred embodiments of the present invention can be widely used for mobile phones and other communication equipment as multiplexers, front-end circuits, or communication devices including acoustic wave filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
 a first filter circuit on a first path that connects a first terminal to a second terminal; and
 an additional circuit connected to the first path; wherein
 the first filter circuit includes:
  one or more series arm resonators; and
  a longitudinally coupled resonator connected to a predetermined series arm resonator of the one or more series arm resonators;
 the longitudinally coupled resonator includes:
  a first acoustic wave resonator; and
  a first reflector in a propagation direction of an acoustic wave excited by the first acoustic wave resonator with respect to the first acoustic wave resonator;
 the additional circuit includes a second acoustic wave resonator on an opposite side of the first acoustic wave resonator with respect to the first reflector in the propagation direction of the acoustic wave;
 the second acoustic wave resonator includes a first end connected to the first path through a second path that is different from the first path and a second end connected to ground;
 the predetermined series arm resonator is connected to a portion of the first path between a connection node at which the second acoustic wave resonator is connected to the first path and the longitudinally coupled resonator;
 the first acoustic wave resonator and the second acoustic wave resonator each include an IDT electrode; and
 the IDT electrode of the first acoustic wave resonator is at least partly overlapped with the IDT electrode of the second acoustic wave resonator in the propagation direction of the acoustic wave.

2. The acoustic wave filter according to claim 1, wherein
 the IDT electrode of the second acoustic wave resonator includes a plurality of comb electrodes that face each other; and
 a comb electrode of the plurality of comb electrodes is connected to a portion of the first path located on an opposite side of the longitudinally coupled resonator with respect to the predetermined series arm resonator through the second path, and another comb electrode thereof is connected to the ground.

3. The acoustic wave filter according to claim 1, wherein the additional circuit includes a second reflector on an opposite side of the first reflector with respect to the second acoustic wave resonator in the propagation direction of the acoustic wave.

4. The acoustic wave filter according to claim 1, wherein the additional circuit includes a reactor on the second path.

5. The acoustic wave filter according to claim 1, wherein
the additional circuit includes a plurality of the second acoustic wave resonators; and
the plurality of the second acoustic wave resonators are on the opposite side of the first acoustic wave resonator with respect to the first reflector in the propagation direction of the acoustic wave.

6. The acoustic wave filter according to claim 1, wherein
the additional circuit includes a plurality of the second acoustic wave resonators; and
the plurality of the second acoustic wave resonators are provided at respective outer side portions of the longitudinally coupled resonator in the propagation direction of the acoustic wave.

7. The acoustic wave filter according to claim 1, wherein
the longitudinally coupled resonator includes a plurality of the first acoustic wave resonators connected in parallel; and
the additional circuit is between the plurality of the first acoustic wave resonators in the propagation direction of the acoustic wave.

8. The acoustic wave filter according to claim 1, wherein the first filter circuit further includes another resonator that is different from the one or more series arm resonators.

9. The acoustic wave filter according to claim 1, wherein
the additional circuit includes a plurality of the second acoustic wave resonators;
the second acoustic wave resonator of the plurality of the second acoustic wave resonators includes a first end connected to a portion of the first path on a side of the first terminal and a second end connected to the ground; and
the other second acoustic wave resonator that is different from the second acoustic wave resonator includes a first end connected to a portion of the first path on a side of the second terminal and a second end connected to the ground.

10. A multiplexer comprising:
the austic wave filter of claim 1; and
a second filter circuit that is different from the acoustic wave filter; wherein
the acoustic wave filter and the second filter circuit are connected to a common terminal; and on the first path, the connection node at which the second acoustic wave resonator is connected to the first path is closer to the common terminal than a connection node at which the predetermined series arm resonator is connected to the first path.

11. The multiplexer according to claim 10, wherein the additional circuit and the first filter circuit of the acoustic wave filter have opposite signal phases in a pass band of the second filter circuit.

12. The multiplexer according to claim 10, wherein
the IDT electrode of the second acoustic wave resonator includes a plurality of comb electrodes that face each other; and
a comb electrode of the plurality of comb electrodes is connected to a portion of the first path located on an opposite side of the longitudinally coupled resonator with respect to the predetermined series arm resonator through the second path, and another comb electrode thereof is connected to the ground.

13. The multiplexer according to claim 10, wherein the additional circuit includes a second reflector on an opposite side of the first reflector with respect to the second acoustic wave resonator in the propagation direction of the acoustic wave.

14. The multiplexer according to claim 10, wherein the additional circuit includes a reactor on the second path.

15. The multiplexer according to claim 10, wherein
the additional circuit includes a plurality of the second acoustic wave resonators; and
the plurality of the second acoustic wave resonators are on the opposite side of the first acoustic wave resonator with respect to the first reflector in the propagation direction of the acoustic wave.

16. The multiplexer according to claim 10, wherein
the additional circuit includes a plurality of the second acoustic wave resonators; and
the plurality of the second acoustic wave resonators are provided at respective outer side portions of the longitudinally coupled resonator in the propagation direction of the acoustic wave.

17. The multiplexer according to claim 10, wherein
the longitudinally coupled resonator includes a plurality of the first acoustic wave resonators connected in parallel; and
the additional circuit is between the plurality of the first acoustic wave resonators in the propagation direction of the acoustic wave.

18. The multiplexer according to claim 10, wherein the first filter circuit further includes another resonator that is different from the one or more series arm resonators.

\* \* \* \* \*